(12) United States Patent
Wang et al.

(10) Patent No.: US 8,378,669 B2
(45) Date of Patent: Feb. 19, 2013

(54) FREQUENCY-SHIFT CMOS MAGNETIC BIOSENSOR ARRAY WITH SINGLE BEAD SENSITIVITY AND NO EXTERNAL MAGNET

(75) Inventors: Hua Wang, Pasadena, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 827 days.

(21) Appl. No.: 12/559,517

(22) Filed: Sep. 15, 2009

(65) Prior Publication Data

US 2010/0134097 A1 Jun. 3, 2010

Related U.S. Application Data

(63) Continuation-in-part of application No. 12/399,603, filed on Mar. 6, 2009, and a continuation-in-part of application No. 12/399,320, filed on Mar. 6, 2009, now Pat. No. 8,274,021.

(60) Provisional application No. 61/068,513, filed on Mar. 7, 2008, provisional application No. 61/068,514, filed on Mar. 7, 2008, provisional application No. 61/192,087, filed on Sep. 15, 2008, provisional application No. 61/194,605, filed on Sep. 29, 2008.

(51) Int. Cl.
*G01N 27/72* (2006.01)
(52) U.S. Cl. ........... 324/228; 324/204; 324/762.01; 324/762.08; 702/117
(58) Field of Classification Search .......... 324/228, 324/204, 762.01, 762.08–762.09; 702/117
See application file for complete search history.

(56) References Cited

U.S. PATENT DOCUMENTS

| | | | | | |
|---|---|---|---|---|---|
| 4,932,255 | A | * | 6/1990 | Brace et al. | 73/204.11 |
| 6,049,157 | A | * | 4/2000 | Kobayashi | 310/316.01 |
| 6,052,080 | A | * | 4/2000 | Magori | 342/118 |
| 6,078,208 | A | * | 6/2000 | Nolan et al. | 327/512 |
| 2003/0169032 | A1 | * | 9/2003 | Minchole et al. | 324/204 |
| 2008/0258721 | A1 | * | 10/2008 | Guo et al. | 324/252 |
| 2008/0309329 | A1 | * | 12/2008 | Kahlman et al. | 324/228 |

* cited by examiner

*Primary Examiner* — Huy Q Phan
*Assistant Examiner* — Temilade S Rhodes-Vivour
(74) *Attorney, Agent, or Firm* — Milstein Zhang & Wu LLC; Joseph B. Milstein

(57) ABSTRACT

According to one aspect, an integrated magnetic particle measurement device for detecting a presence or absence of magnetic particles in a sample volume includes at least one sensor cell having a differential sensor pair. An active sensor oscillator frequency is responsive to one or more magnetic particles situated within a sample volume. The sensor cell is configured to be operative in the absence of an externally applied magnetic field. A frequency measurement circuit provides as a time-multiplexed output a first count representative of the active sensor oscillator frequency and a second count representative of the reference sensor oscillator frequency. A calculated difference between the first count and the second count is indicative of a presence or an absence of one or more magnetic particles within the sample volume. An integrated magnetic particle measurement system array and a method for detecting one or more magnetic particles are also described.

27 Claims, 41 Drawing Sheets

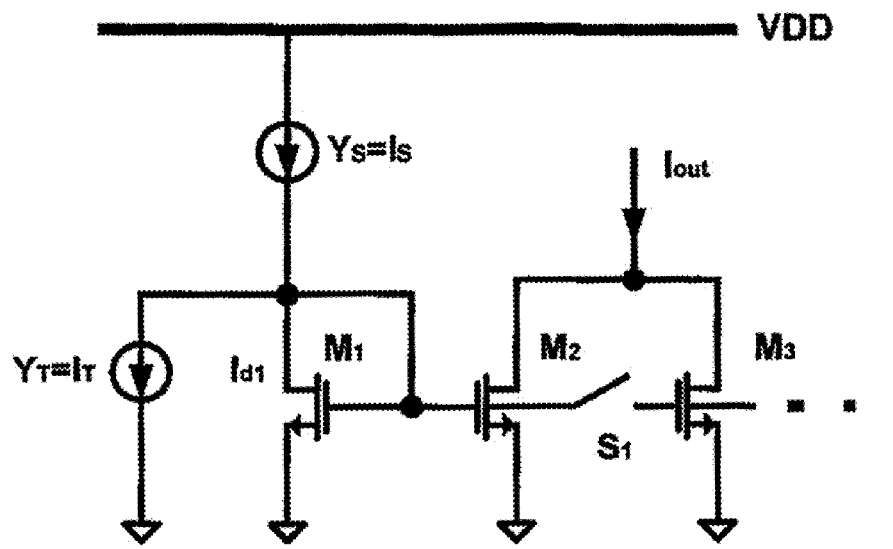
FIG. 5
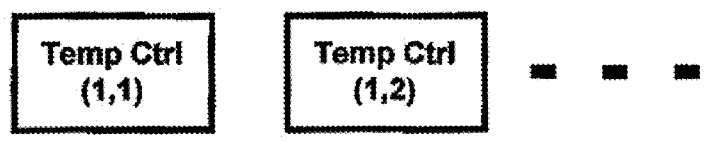
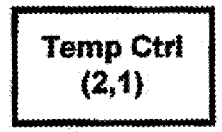
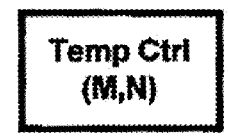
FIG. 6

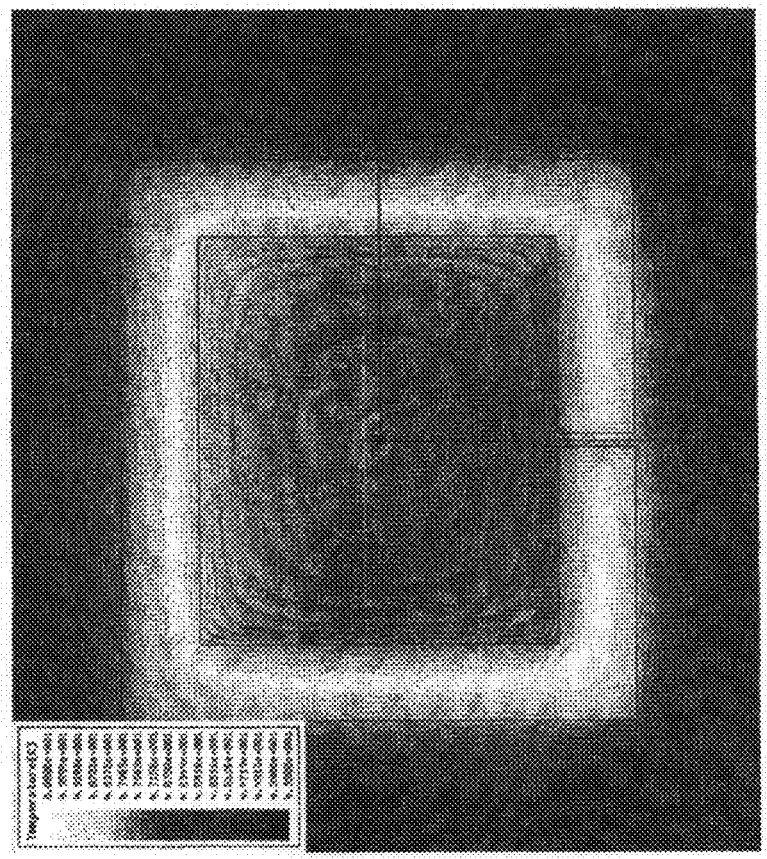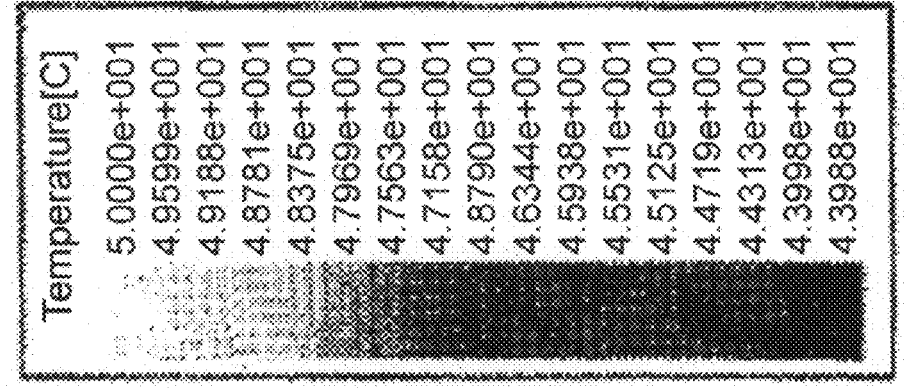

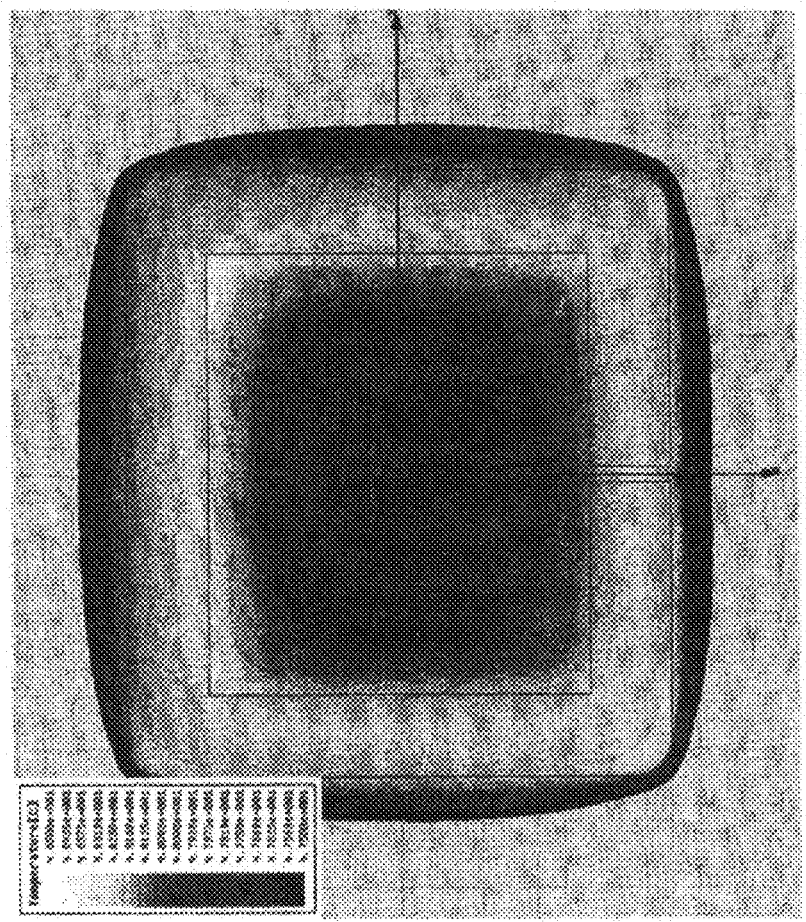
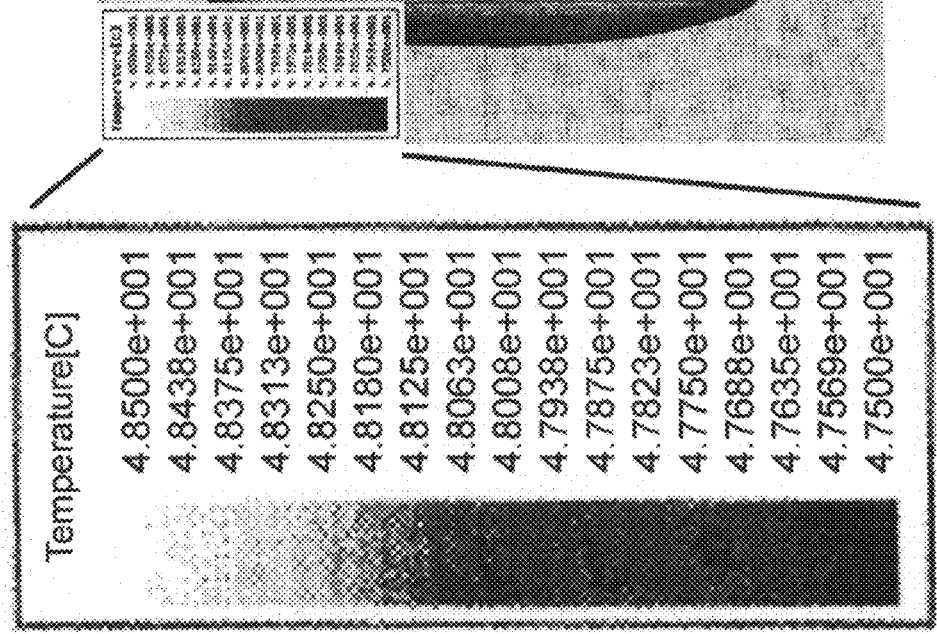
FIG. 14
FIG. 14A
FIG. 14B

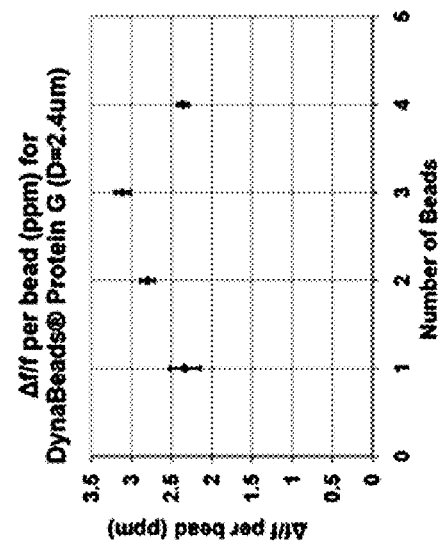
FIG. 19A
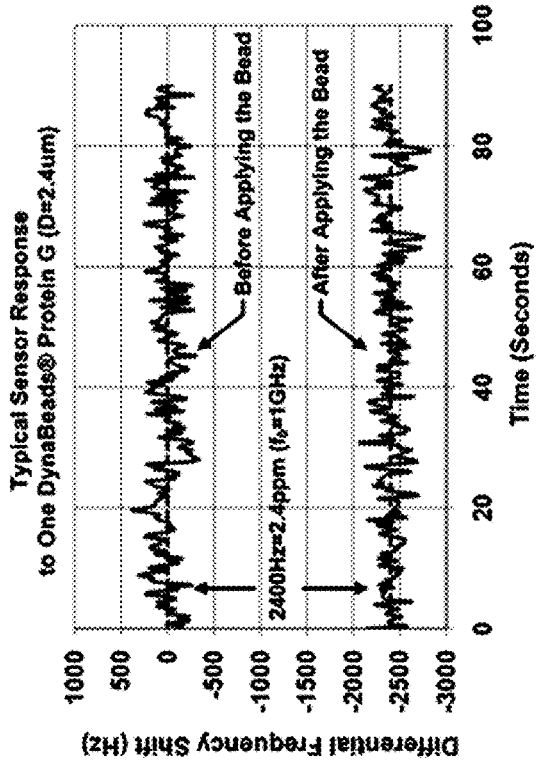
FIG. 19B
FIG. 19C

Magnetic Particle Sensing Scheme Comparison Table

| | Sensitivity (# of Beads) | External Biasing Magnetic Field | Special Fabrication |
|---|---|---|---|
| This Design | 1 (Diameter 2.4um) | No | No |
| Spin Valve Sensor [1] | 1 (Diameter 2.8um) | Yes (2 Electromagnets for AC & DC Field) | Yes |
| Hall Sensor [3] | 1 (Diameter 2.8um) | Yes (2 Electromagnets for AC & DC Field) | No |
| NMR Relaxometer [4] | Not Reported | Yes (Rare Earth Magnet) | No |

FIG. 22

| Bead Type | Bead Size (Diameter) | Recorded Δf/f per bead | Sensitivity (# of Beads) | SNR | Averaging Time (s) |
|---|---|---|---|---|---|
| DynaBeads® M-450 Epoxy | 4.5μm | 9.6ppm | 1 | 40.36dB | 90 |
| DynaBeads® Protein | 2.4μm | 2.6ppm | 1 | 29.02dB | 90 |
| DynaBeads® MyOne™ Carboxylic Acid | 1μm | 0.23ppm | 1 | 8.65dB | 160 |
| Polystyrene Bead | 1μm | 0.0035ppm† | | | |

FIG. 27

FREQUENCY-SHIFT CMOS MAGNETIC BIOSENSOR ARRAY WITH SINGLE BEAD SENSITIVITY AND NO EXTERNAL MAGNET

CROSS-REFERENCE TO RELATED APPLICATIONS

This application is a continuation-in-part of co-pending U.S. patent application, EFFECTIVE-INDUCTANCE-CHANGE BASED MAGNETIC PARTICLE SENSING, Ser. No. 12/399,603, filed Mar. 6, 2009, which application claimed the priority and benefit of U.S. provisional patent application Ser. No. 61/068,513, filed Mar. 7, 2008, and a continuation-in-part of U.S. patent application, FULLY INTEGRATED TEMPERATURE REGULATOR FOR BIOCHEMICAL APPLICATIONS, Ser. No. 12/399,320, filed Mar. 6, 2009, which application claimed the priority and benefit of U.S. provisional patent application Ser. No. 61/068, 514, filed Mar. 7, 2008. This application also claims priority to and the benefit of U.S. provisional patent application, ULTRASENSITIVE MAGNETIC PARTICLE SENSOR SYSTEM, Ser. No. 61/192,087, filed Sep. 15, 2008, and U.S. provisional patent application, A FREQUENCY-SHIFT CMOS MAGNETIC BIOSENSOR ARRAY WITH SINGLEBEAD SENSITIVITY AND NO EXTERNAL MAGNET, Ser. No. 61/194,605, filed Sep. 29, 2008. Each of the above-identified applications is incorporated herein by reference in its entirety.

STATEMENT REGARDING FEDERALLY FUNDED RESEARCH OR DEVELOPMENT

The invention described herein was made in the performance of work under a National Science Foundation contract NSF ECS-0239343, and is subject to the provisions of Public Law 96-517 (35 U.S.C. §202) in which the Contractor has elected to retain title.

FIELD OF THE INVENTION

The invention relates to magnetic sensor in general and particularly to an integrated magnetic sensor that employs a magnetic sensor array.

BACKGROUND OF THE INVENTION

Conventional fluorescence microarrays for Point-of-Care (POC) molecular-level diagnosis involve bulky and expensive optical instruments. Magnetic biosensors developed thus far require externally generated magnetic biasing fields and/or exotic post-fabrication processes. These external magnetic field sources increase the system's size and total power consumption, and raise the system cost.

There is a need for a low-power scalable magnetic particle sensor array which provides good sensing sensitivity without the need for external magnetic fields.

SUMMARY OF THE INVENTION

According to one aspect, an integrated magnetic particle measurement device for detecting a presence or absence of magnetic particles in a sample volume includes a substrate having a surface. The at least one sensor cell includes a differential sensor pair. The differential sensor pair includes an active sensor oscillator configured to have an active sensor oscillator frequency. The active sensor oscillator frequency is responsive to one or more magnetic particles situated within a sample volume. A reference oscillator is configured to have a reference sensor oscillator frequency. The at least one sensor cell is configured to be operative in the absence of an externally applied magnetic field. A selector circuit is coupled to the active sensor oscillator and to the reference oscillator and configured to provide a selected one of the active sensor oscillator frequency and the reference sensor oscillator frequency at a selector circuit output terminal. A frequency measurement circuit has a frequency measurement output terminal. The frequency measurement circuit is communicatively coupled to the selector circuit output terminal. The frequency measurement circuit is configured to provide as a time-multiplexed output at the frequency measurement output terminal a selected one of a first count representative of the active sensor oscillator frequency and a second count representative of the reference sensor oscillator frequency. A calculated difference between the first count and the second count is indicative of a presence or an absence of one or more magnetic particles within the sample volume of the active sensor oscillator of the at least one sensor cell.

In one embodiment, the frequency measurement circuit includes a counter circuit.

In another embodiment, the frequency measurement circuit further includes a down shift circuit electrically coupled via the selector circuit to the active sensor oscillator and the reference sensor oscillator of each sensor cell and has a down shift circuit output terminal. The down shift circuit is configured to down shift in a time multiplexed manner from the at least one sensor cell the active sensor oscillator frequency to a downshifted active sensor oscillator frequency and the reference sensor oscillator frequency to a downshifted reference sensor oscillator frequency, and to provide the downshifted active sensor oscillator frequency and the downshifted reference sensor oscillator frequency at the down shift circuit output terminal.

In yet another embodiment, the down shift circuit has a two-step down-conversion architecture.

In yet another embodiment, the integrated magnetic particle measurement device further includes an input terminal configured to accept an external frequency and the down shift circuit includes a first digital divider electrically coupled to an input of a first mixer. The first digital divider is configured to generate a first local oscillator frequency and a second digital divider electrically coupled to an input of a second mixer, the second digital divider configured to generate a second local oscillator frequency.

In yet another embodiment, the selector circuit includes a multiplexer.

In yet another embodiment, a number N of sensor cells are configured as an integrated measurement array, where N is an integer greater than 1.

In yet another embodiment, the active sensor oscillator and the reference sensor oscillator includes a low noise oscillator.

In yet another embodiment, the low noise oscillator includes a complementary cross-coupled pair.

In yet another embodiment, the complementary cross-coupled pair includes at least a selected one of an NMOS pair and a PMOS pair disposed on the substrate in a symmetrical layout and configured to suppress flicker noise.

In yet another embodiment, the active sensor oscillator and the reference sensor oscillator are configured to operate at two different non-harmonically related frequencies.

In yet another embodiment, a temperature of the active sensor oscillator and a temperature of the reference sensor oscillator are substantially controlled by a common temperature controller.

In yet another embodiment, the common temperature controller includes a proportional to absolute temperature circuit configured to sense a temperature of at least one of the sensor cells.

In yet another embodiment, the integrated measurement system further includes at least one digital input configured to control the multiplexer.

In yet another embodiment, the integrated measurement system is implemented in CMOS.

In yet another embodiment, at least of one of the active sensor oscillator and the reference sensor oscillator includes an LC resonator.

In yet another embodiment, a molecular-level diagnosis system includes at least one integrated magnetic particle measurement device as described herein above. An electronic circuit is configured to calculate and record for each sensor cell the difference of the active sensor oscillator frequency and the reference sensor oscillator frequency. A power supply electrically coupled to the integrated measurement device and the electronic circuit.

In yet another embodiment, the molecular-level diagnosis system further includes a display configured to indicate a presence or an absence of one or more magnetic particles within a sample volume of the active sensor oscillator of each sensor cell, the display electrically powered by the power supply.

In yet another embodiment, the molecular-level diagnosis system is configured as a portable system.

In yet another embodiment, the power supply includes at least one battery.

In yet another embodiment, the molecular-level diagnosis system further includes a microfluidic structure configured to provide a sample to a sample volume.

In yet another embodiment, the microfluidic structure includes polydimethylsiloxane.

In yet another embodiment, the molecular-level diagnosis system is configured as a system selected from the group of systems consisting of a Point-of-Care (POC) system, an in-field medical diagnosis system, an epidemic disease control system, a biohazard detection system, a PCR system, and a forensic analysis system.

In yet another embodiment, the electronic circuit includes a microprocessor.

In yet another embodiment, the active sensor oscillator frequency and the reference sensor oscillator frequency are downshifted before the difference between them is calculated.

According to another aspect, a method for detecting one or more magnetic particles, includes the steps of: (a) providing an integrated measurement system having a plurality of N sensor cells, where N is an integer greater than 1, each of the sensor cells being represented by an integer in the range of 1 to N, each of the sensor cells including an active sensor oscillator configured to have an active sensor oscillator frequency and a reference oscillator configured to have a reference sensor oscillator frequency, a difference between the active sensor oscillator frequency and the reference sensor oscillator frequency being representative of a presence or an absence of one or more magnetic particles within a sensor volume of the sensor cell; (b) selecting an integer in the range of 1 to N; for the selected integer, (b1) measuring a selected one of the active sensor oscillator frequency and the reference sensor oscillator frequency of the sensor cell; (b2) waiting for a first delay time; and (b3) measuring after the first delay time the other of the active sensor oscillator frequency and the reference sensor oscillator frequency for the sensor cell; (c) recording a start time for the measurement according to step (b1); (d) selecting a different integer in the range of 1 to N, and repeating steps (b1) through (b3) for the integer; (e) repeating step (d) until all of the integers in the range 1 to N have been employed one time; (f) determining whether a period substantially equivalent to a time constant of a flicker process has elapsed since the recording of the start time in step (c); (g) if a period substantially equivalent to a time constant of a flicker process has elapsed since the recording of the start time in step (c), repeating steps (b) though (f) a desired number of times, and if a period substantially equivalent to a time constant of a flicker process has not elapsed since the recording of the start time in step (c), performing step (h); (h) waiting until a period substantially equivalent to a time constant of a flicker process has elapsed since the recording of the start time in step (c), and then repeating steps (b) though (f) a desired number of times; (i) upon completing the steps (b) through (h) the desired number of times, computing for each sensor cell a presence or absence of one or more magnetic particles; and (j) recording a result for each sensor cell indicative of the presence or absence of one or more magnetic particles.

According to yet another aspect, an integrated magnetic particle measurement system array for detecting a presence or absence of magnetic particles in a sample volume, includes a substrate having a surface. Each of two or more sensor cells includes a differential sensor pair. Each differential sensor pair includes an active sensor oscillator configured to have an active sensor oscillator frequency. The active sensor oscillator frequency is responsive to one or more magnetic particles situated within a sample volume. A reference oscillator is configured to have a reference sensor oscillator frequency. The two or more sensor cells are configured to be operative in the absence of an externally applied magnetic field. A down shift circuit is electrically coupled via a multiplexer to the active sensor oscillator and the reference sensor oscillator of each sensor cell and has a down shift circuit output. The down shift circuit is configured to down shift in a time multiplexed manner from each of the sensor cells the active sensor oscillator frequency to a downshifted active sensor oscillator frequency and the reference sensor oscillator frequency to a downshifted reference sensor oscillator frequency. A counter is communicatively coupled to the down shift circuit output and is configured to output at a count output terminal from each of the sensor cells in the time multiplexed manner a first count representative of the active sensor oscillator frequency and a second count representative of the reference sensor oscillator frequency, and wherein a calculated difference between the first count and the second count indicates a presence or an absence of one or more magnetic particles within the sample volume of the active sensor oscillator of each sensor cell.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 5 is a circuit diagram of an illustrative temperature-to-electrical-signal amplifier circuit that provides a drive signal $I_{out}$ in the form of a current.

FIG. 6 is a schematic diagram that illustrates how a plurality of temperature controllers can be provided in an array.

FIG. 13 is a diagram that includes FIG. 13A that illustrates the temperature profile of the heater ring with the ambient temperature of 27° C. and heater power of 350 mW. The plotting temperature range is 43.5° C. to 50° C. as shown in FIG. 13B.

FIG. 14 is another diagram that includes FIG. 14A that illustrates the temperature profile of the heater ring with the ambient temperature of 27° C. and heater power of 350 mW. The plotting temperature range is 47.5° C. to 48.5° C. as shown in FIG. 14B.

FIG. 19A shows a table that summarizes sensor performance for different types and sizes of magnetic beads.

FIG. 19B shows an exemplary graph of typical sensor response to one DynaBeads® Protein G (D=2.4 μm).

FIG. 19C shows an exemplary graph of Δf/f per bead (ppm) for DynaBeads® Protein G (D=2.4 μm).

FIG. 22 shows a table comparing the techniques described herein with prior art magnetic particle sensing schemes.

FIG. 27 shows a table of typical sensor response to magnetic beads of various types and diameters.

The drawings are not necessarily to scale, emphasis instead generally being placed upon illustrating the principles of the invention. In the drawings, like numerals are used to indicate like parts throughout the various views.

DETAILED DESCRIPTION

Figure 1:
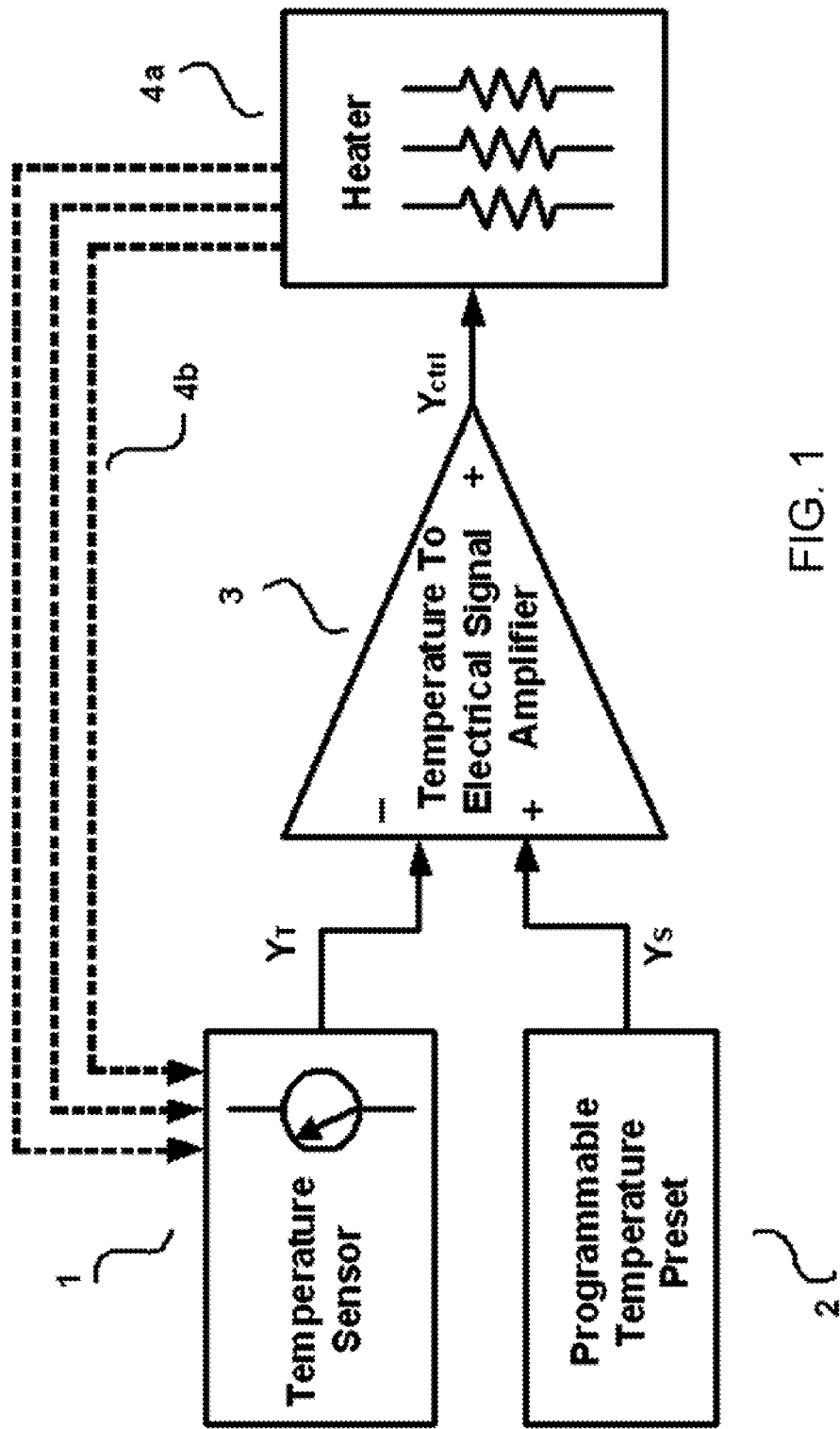
FIG. 1 is a schematic block diagram of an illustrative embodiment of the temperature regulator, according to principles of the invention.

Methods of Point-of-Care (POC) molecular-level diagnosis that employ an advanced bio-sensing system can achieve high sensitivity and portability at low power consumption and at low cost. Such systems and methods are useful for a variety of applications such as in-field medical diagnosis, epidemic disease control, biohazard detection, and forensic analysis. We describe hereinbelow a novel low-power scalable frequency-shift magnetic particle sensor array (a magnetic bio-sensor) suitable for use in a POC molecular-level bio-sensing system that can be fabricated in bulk CMOS, and which can provide single bead detection sensitivity without any need for AC or DC external magnetic fields.

We begin by describing the temperature regulator technology, which has also been described in co-pending U.S. patent application, FULLY INTEGRATED TEMPERATURE REGULATOR FOR BIOCHEMICAL APPLICATIONS, Ser. No. 12/399,320, filed Mar. 6, 2009, the entire contents of which application is incorporated herein by reference for all purposes. The temperature regulator technology can be implemented as a fully integrated system that does not need any external heating or cooling devices. This enables further high-level integration with other structures such as microfluidic arrays and microfluidic systems. The temperature regulator technology can control the temperature accurately within a miniaturized region. This leads to significantly reduced power consumption and to short response times and high precision control in both the time and spatial domains. Our design can be easily extended to a temperature controller array, where individual chemical and/or biochemical sensing or reaction chambers, such as one or more sensor cells, can have independent and programmable (or reprogrammable) temperatures. It is expected that standard semiconductor processing technology can be used to prepare the systems and devices of the invention. It is contemplated that systems and devices according to the invention can find use in hybrid lab-on-chip (LOC) for point-of-care (POC) medical diagnostic support applications.

First, we describe the integrated temperature control at a fundamental level with all the core functional blocks addressed. We then describe several illustrative implementation variations. We provide the details of an illustrative design with simulation results and layout configurations.

Our approach to temperature control can be divided into four blocks, including: 1. circuits to sense the absolute temperature with or without reprogrammable capability; 2. circuits to generate a temperature-independent reference signal with or without reprogrammable capability; 3. circuits to calculate and amplify the temperature deviation to provide suitable electrical signals for sensing and control; and 4. an electrical-thermal feedback loop comprising a heater and a sensor cell. The electrical-thermal feedback loop can include a structure for regulating temperature, such as a sensor circuit.

Illustrative Embodiment

FIG. 1 is a schematic block diagram of an illustrative embodiment of the temperature regulator. The method of operation is also described herein.

The temperature sensor, indicated as 1, receives a temperature signal that it uses to measure the absolute temperature of the regulated sample, and provides as output an electrical signal denoted as $Y_T$. The temperature signal received by the temperature sensor 1 can be any convenient signal, for example a conducted thermal signal. The temperature reference 2 provides as output a temperature independent electrical signal, $Y_S$, which indicates (or corresponds to) the programmed target temperature. The temperature to electrical signal amplifier 3, which can be a differential amplifier of any convenient type, obtains a difference signal representing the difference between $Y_T$ and $Y_S$, amplifies the difference signal, and provides as output a control signal $Y_{ctrl}$ to control the heater 4a. Note that both $Y_T$ and $Y_S$ can be in the form of any of voltage, current, or power. Both $Y_T$ and $Y_S$ can be either differential or single-ended and either analog or digital in nature. The heater 4a generates heat according to the value of $Y_{ctrl}$. This generated heat flow conducts through a thermal pathway 4b which includes the heater, designed sample chamber, and the chip substrate and eventually dissipates to the environment. Based on the design of this thermal path, a new temperature value is set at the sample, which is again sensed by the temperature sensor 1. This completes the thermal-electrical feedback path.

In other alternative embodiments, the temperature signal received by the temperature sensor 1 could be any of a signal from a thermocouple, a signal from a thermistor, or a signal from a pyrometric detector.

The electrical-thermal feedback loop can also comprise the substrate itself and/or some electrical circuits on the substrate, such as a biosensor circuit, e.g. the effective-inductance-change based magnetic particle sensor described in co-pending application U.S. Ser. No. 12/399,603, the entire contents of which application is incorporated herein by reference for all purposes. The temperature controller can therefore stabilize the temperature of the substrate and/or the circuits on the substrate. This could provide a stable operation of the circuits or other circuits on the substrate to achieve a better performance, such as a better sensitivity/lower drifting/lower noise floor for biosensors.

By using the negative feedback and by programming the feedback loop to have a high loop-gain, the temperature regulator can more precisely control the temperature that one wants to regulate. This also achieves a lower temperature regulating offset residual when the ambient temperature is changed or is different from the target temperature set for the regulator.

By using an effective integration element in the negative feedback loop, such an integrator in the digital domain, with some loop dynamics stabilizer, such as electrical or thermal filters, a higher order thermal loop can be achieved which will have zero temperature regulating offset at the regulator's operation when the ambient temperature is changed or is different from the target temperature set for the regulator.

By designing the heater layout geometry both in shape (e.g. circular or square with/without some island structures in the middle) and dimension, a very homogeneous regulated temperature profile can be achieved for the location of concern, such as the surface of the substrate or the target electrical circuit for temperature regulating.

By choosing the substrate shape and material, by providing thermal isolation around the substrate (top and/or peripheral and/or bottom), and/or adjusting the temperature-to-heater power gain in the electrical-thermal loop, the temperature regulator can be designed with a very fast response and quick temperature settling for a temperature regulation operation.

Possible Implementation Variations

We now describe several implementation variations for the aforementioned elements of the illustrative temperature regulators. The designs provided are examples for purposes of illustration, and other alternatives that might be implemented are also contemplated, so that any chemical/biochemical temperature regulator based on the operational mechanisms described herein are also contemplated.

Temperature Sensor 1

The output $Y_T$ of temperature sensor 1 can be implemented as any monotonic function with respect to the temperature. The small signal gain can be defined mathematically, as expressed in Eq. (1). In particular, a linear relationship can be designed which will give a constant small signal gain as a function of temperature:

$$Gain_{sensor} = \frac{\partial Y_T}{\partial T} \qquad \text{Eq. (1)}$$

Figure 2:
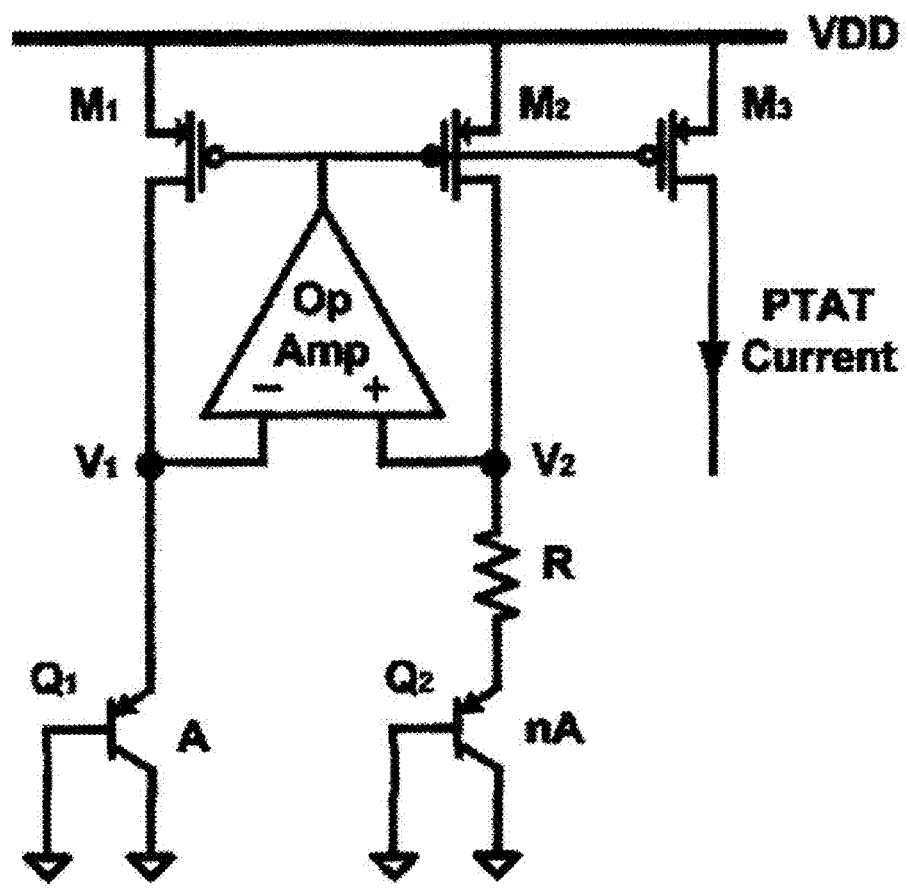
FIG. 2 is circuit diagram for an illustrative PTAT current generation circuit that provides a current signal proportional to temperature.

One circuit that can be used to provide such capability is the PTAT (proportional to absolute temperature) circuit. In one embodiment, the PTAT circuit shown in FIG. 2 can be utilized for the purpose of temperature sensing.

Due to the matching between transistors $M_1$ and $M_2$, the collector current through $Q_1$ and $Q_2$ are the same. Those of skill in the circuit arts will recognize that the operational amplifier causes equal voltage values to appear at nodes $V_1$ and $V_2$. The collector current can be derived as:

$$\frac{V_T \ln(n)}{R} = \frac{KT\ln(n)}{qR}.$$

Figure 3:
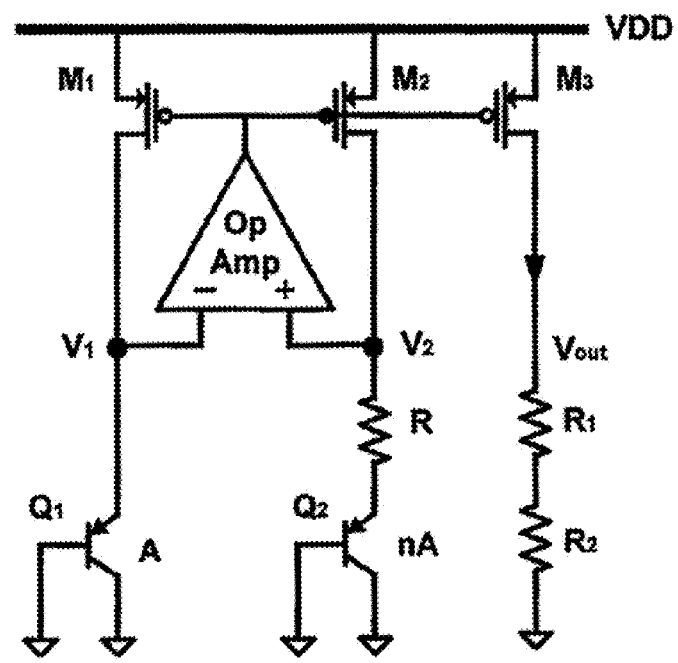
FIG. 3 is circuit diagram for an illustrative PTAT voltage generation circuit that provides a voltage signal proportional to temperature.

This PTAT current can be converted to a proportional PTAT voltage by adding a resistive load at $M_3$ shown in FIG. 3.

In FIG. 3, the values of resistors $R_1$ and $R_2$ can be tuned to have positive/negative/zero temperature coefficients depending on the specific application that one intends to implement.

Temperature Reference 2

Figure 4:
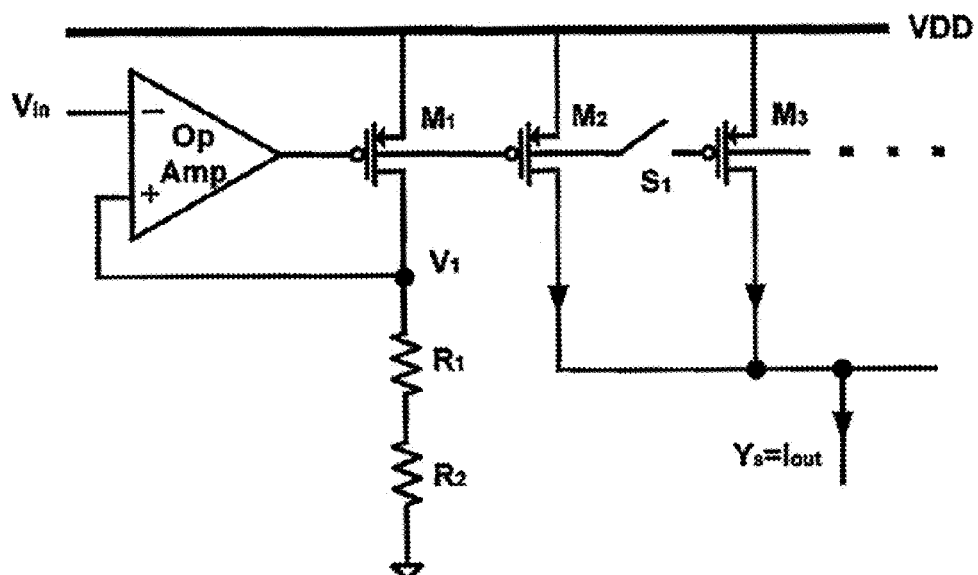
FIG. 4 is a circuit diagram of an illustrative temperature reference circuit that provides a reference signal $Y_S$ in the form of a current.

In general, as long as the difference $Y_S - Y_T$ has enough monotonic gain with respect to temperature, the regulator can always be functional. In particular, the temperature reference signal $Y_S$ can be designed to be temperature-independent and programmable. The provision of $Y_S$ as a voltage signal is readily achieved through widely used band-gap circuitry. FIG. 4 is a circuit diagram of an illustrative temperature reference circuit that provides a reference signal $Y_S$ in the form of a current.

In the temperature reference 2, the operational amplifier forces $V_1$ to equal $V_{in}$. One assumes for this analysis that $V_{in}$ is temperature independent. For example, $V_{in}$ can be provided by a temperature controlled source that does not vary as the temperature of the specimen of interest varies. Therefore, if $R_1$ and $R_2$ are tuned to have a substantially zero temperature coefficient, the current through transistor $M_1$ will also be temperature independent. This current is mirrored through a current source array shown by transistor $M_2$ and transistor $M_3$. The total output current can be further set by using the switch, e.g., $S_1$, and additional transistors $M_n$ and switches $S_n$, not shown.

Temperature to Electrical Signal Amplifier 3

Temperature to electrical signal amplifier 3 takes the difference of the two inputs $Y_S$ and $Y_T$ and amplifies the difference signal to a suitable level to provide a signal large enough to drive the heater. An offset may be provided to cause the driving signal to be non-zero under conditions that $Y_S = Y_T$, e.g., to provide a control signal to maintain a temperature at a desired value different from ambient temperature. That is, if $Y_S$ were to correspond to a desired temperature of 39° C. at a sample of interest, and ambient temperature happened to be 20° C., a drive signal would be required to raise the temperature in the vicinity of the sample of interest to the desired 39° C. The temperature controller would then increase power as the temperature of the sample of interest fell below 39° C. and would decrease the power as the temperature of the sample of interest rose above 39° C. Note that the gain is preferred to be programmable to control the loop gain of the thermal-electrical feedback.

One or a cascade of ordinary differential amplifiers can be used as temperature to electrical signal amplifier 3 if the inputs are in voltage form. If the inputs are in current format, current mirrors can be used directly for this amplification purpose, shown in FIG. 5.

FIG. 5 is a circuit diagram of an illustrative temperature-to-electrical-signal amplifier circuit that provides a drive signal $I_{out}$ in the form of a current. In this configuration, the drain current of the transistor $M_1$ is $Id_1 = I_S - I_T$. This current is amplified through a current mirror array, denoted by $M_2$ and $M_3$. Switches, such as S1, can be used to set the current amplification gain.

Electrical Thermal Feedback Loop 4a and 4b

This is a feedback loop which converts the electrical signals back to the thermal domain and completes the loop to make the temperature controller operative.

In various embodiments, the heater can be designed as big power transistor arrays, resistor arrays or a combination of the two. The important issue is the layout of the heater structure. Heaters with different geometry that consume the same DC power will generate different temperature profiles that determine important performance parameters, such as maximum temperature $T_{max}$, and the homogeneity of the temperature distribution. In one embodiment, a heater having a ring structure (or a structure having heaters located at the periphery of an area, for example circumscribing the temperature sensor 1, the temperature reference 2, and the temperature to electrical signal amplifier 3) can be used where both the chamber and the temperature sensing circuitry can be encircled in the middle.

The chamber can be implemented in various technologies. In one embodiment, a low-cost polydimethylsiloxane (PDMS) based chamber can be used to deliver and hold the samples.

Array Configuration

The temperature controller can be extended to an array of temperature controllers for a system that provides a plurality of controlled areas or sensor cells, as represented by FIG. 6. In FIG. 6, an M row by N column rectangular or square array is depicted. Equally well, the shape of an individual heater can be any convenient shape, such as area-filling regular shapes (e.g., squares, triangles, hexagons) or other shapes (rectangles, circles, mixed shapes).

By precisely controlling the temperature of M×N local regions, a programmable temperature distribution can be generated on the global sense with the superposition of all the M×N temperature profiles. This can be used for biochemical circuit applications.

A Design Example

In this section, we present an illustrative design for a temperature controller.

Figure 7:
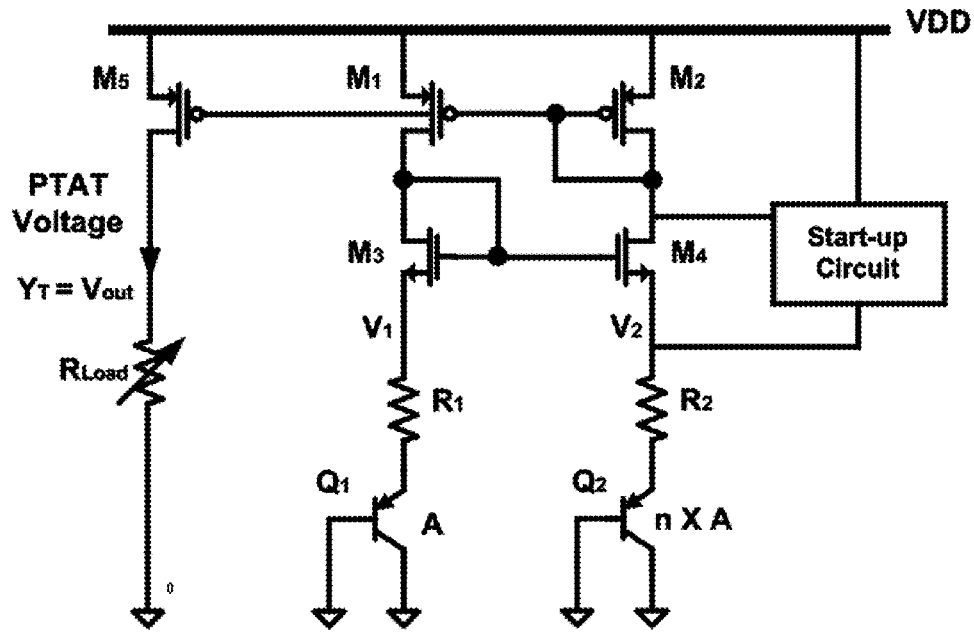
FIG. 7 is a circuit diagram of an illustrative temperature sensing and bandgap circuit.

In this embodiment, the temperature sensing and bandgap circuits can be combined together, shown in FIG. 7.

In FIG. 7, the floating current mirror using transistors $M_1$ through $M_4$ ensures that $V_1 = V_2$ and $Q_1$ and $Q_2$ shares the same collector currents. Therefore, this collector current can be shown as a PTAT current as given by Eq. (2):

$$I_c = \frac{V_T \ln(n)}{R_2 - R_1} \qquad \text{Eq. (2)}$$

The voltage $V_2$ is given by Eq. (3), which can be provided as a bandgap voltage (e.g., independent of temperature):

$$V_2 = \frac{R_2}{R_2 - R_1} V_T \ln(n) + B_{v\theta} \qquad \text{Eq. (3)}$$

Figure 8:
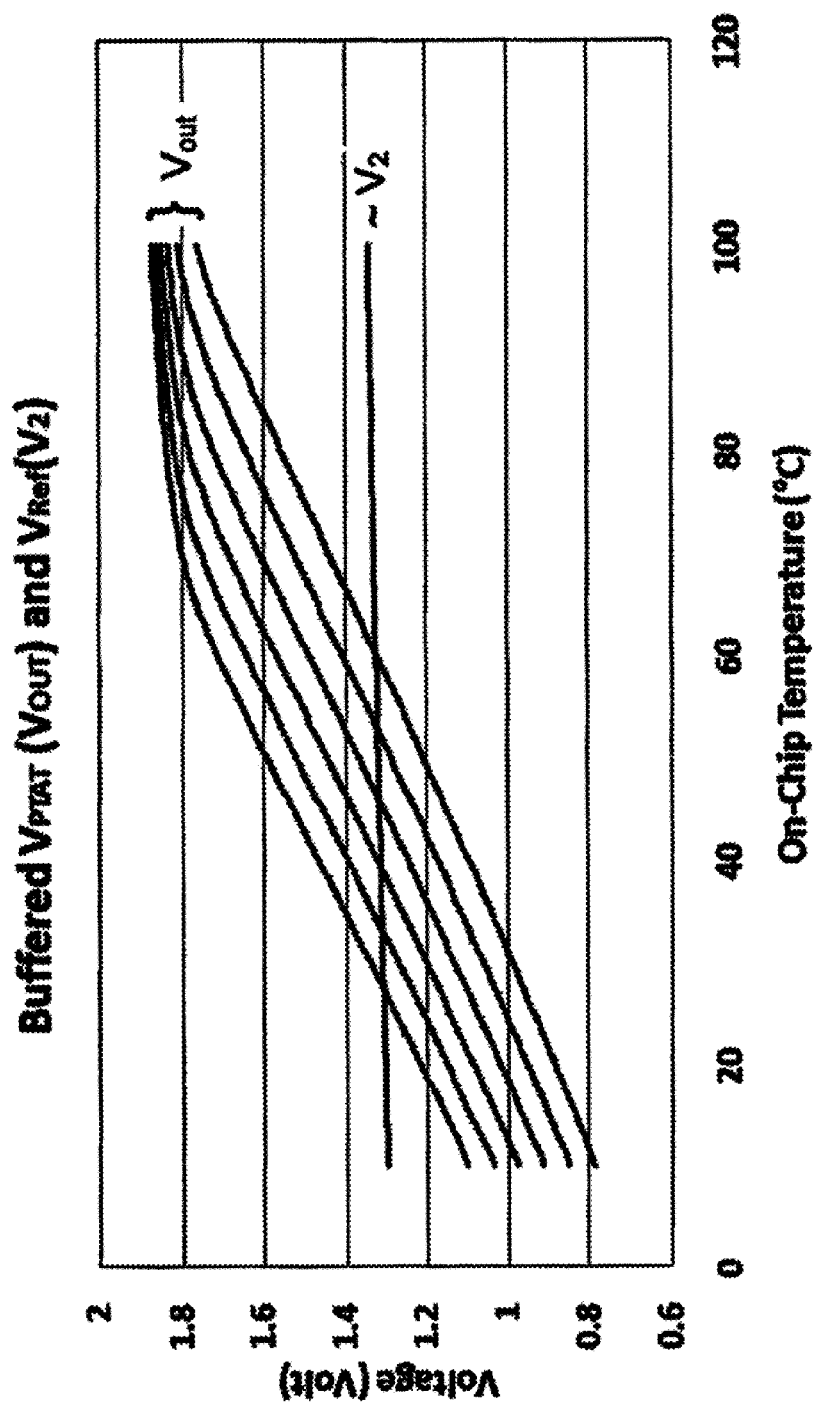
FIG. 8 is a graph that shows the simulated values for $V_{out}$ and $V_2$ for one design embodiment.

The PTAT current is mirrored through $R_{Load}$. Here, $R_{Load}$ is chosen to have positive temperature coefficient (e.g., the resistance vs. temperature behavior typical of metals) to enhance the temperature-to-electrical conversion gain. The tuning ability is achieved by implementing $R_{Load}$ as a digital programmable resistor. The simulated behavior of $V_{out}$ and $V_2$ for the circuit are shown in FIG. 8.

The crossing points of each of the lines denoting $V_{out}$ and the line denoting $V_2$ are the target temperatures for regulating the operation of the system. The multiple lines representing $V_{out}$ show the temperature setting capability.

Figure 9A:
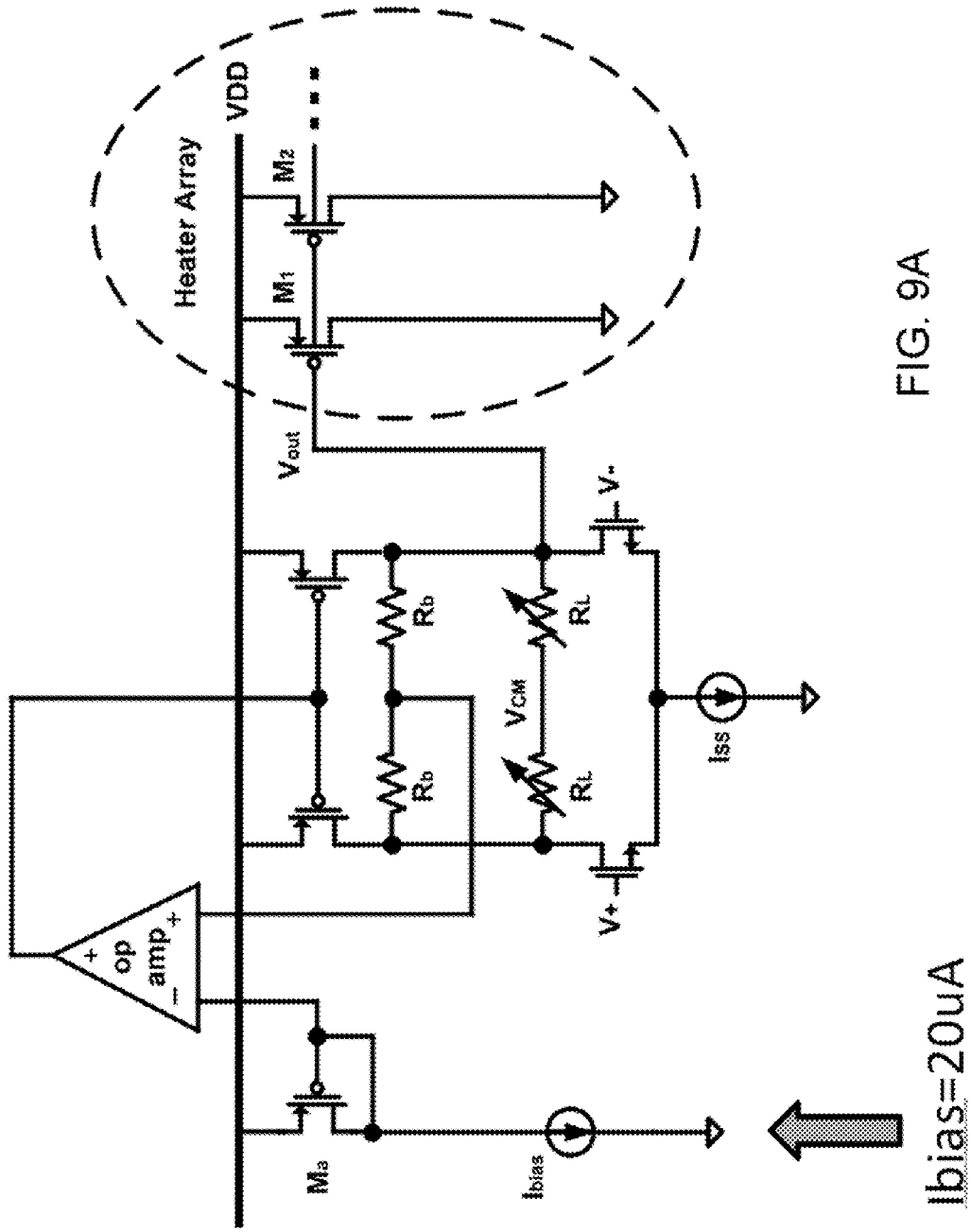
FIG. 9A is an illustrative circuit diagram that shows one embodiment of the 2nd stage of the amplifier together with a heater array.
Figure 9B:
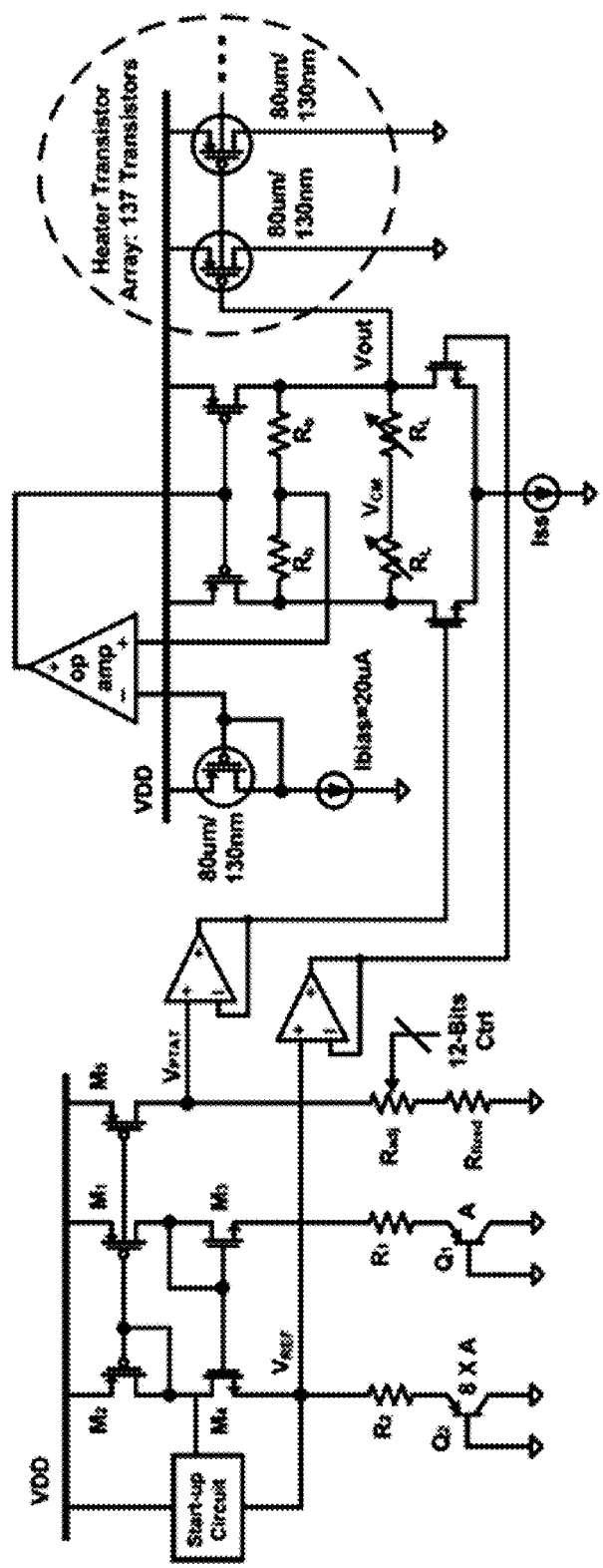
FIG. 9B is a schematic diagram showing one exemplary connection of the circuit of FIG. 7 and the heater driver of FIG. 9A.
Figure 10:
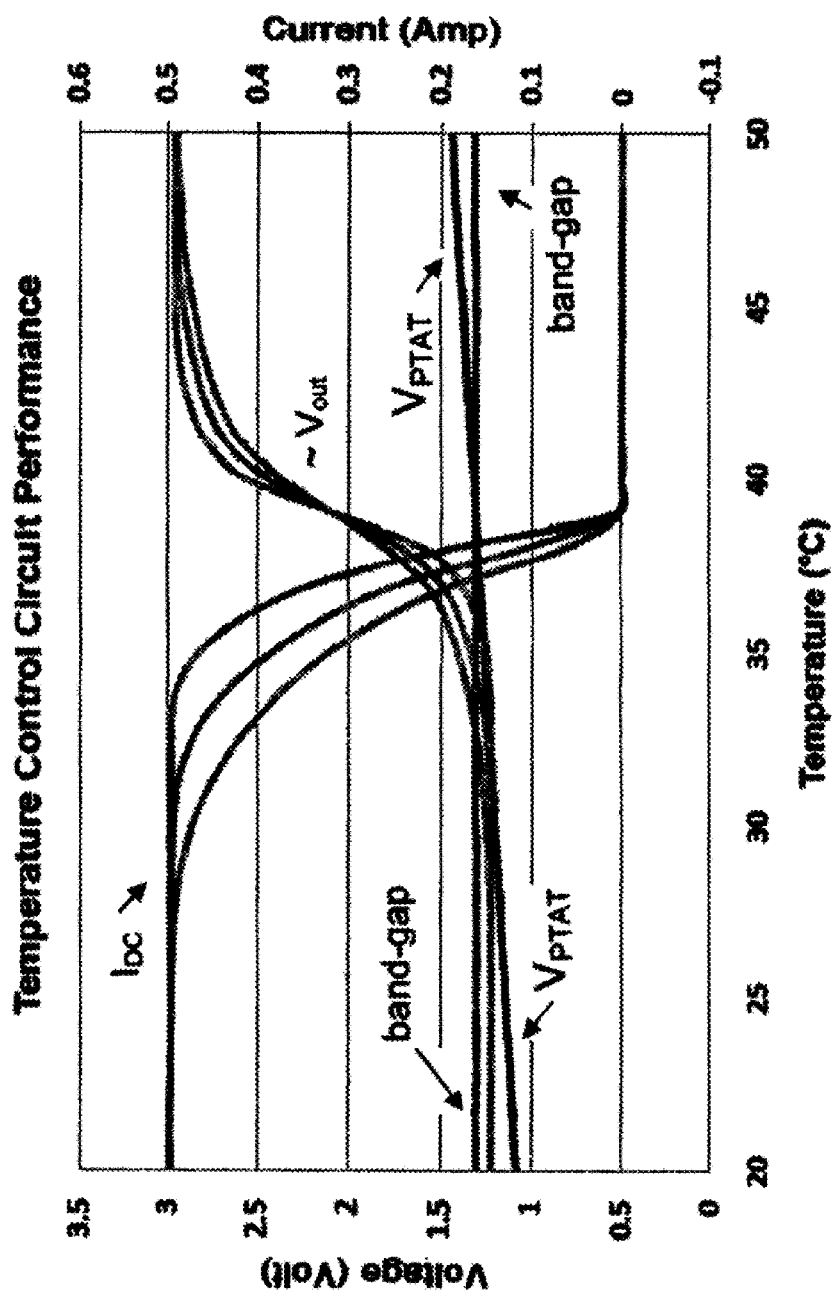
FIG. 10 is a graph that shows the temperature controlling circuit performance.

After suitable DC conversion, the two voltages are fed into a two-stage differential amplifier block. The second stage together with the heater array is shown in detail in FIG. 9A. In FIG. 9A, $M_a$ is identical to the unit transistor used in the heater array ($M_1, M_2 \ldots$). By biasing at a very small current (of the order of 1 µA), the gate voltage of $M_a$ is close to its threshold voltage. The op-amp feedback circuit is used to force the common mode voltage of this stage to track the threshold voltage of $M_a$. Therefore, the output voltage $V_{out}$ will be able to turn on the heater array only when input voltage swing, $V_+-V_-$, is less than zero, which will be determined by the preceding stages. $R_{Load}$ is designed to be digitally programmable to control the gain. FIG. 9B is a schematic diagram showing one exemplary connection of the circuit of FIG. 7 and the heater driver of FIG. 9A. The performance of the driver stage and the heater is shown in FIG. 10.

The band-gap and PTAT voltages show that the target temperature is 39° C. (e.g., their crossing point). The curves that depict the $V_{out}$ to control the heater shown in FIG. 9A also have a crossing point in the vicinity of 39° C. The curves labeled IDC show the DC current drawn by the heater from a 2.6 V supply and all go to zero at approximately 39° C. A set of three curves for both the $V_{out}$ and IDC parameters illustrate the gain tuning capability.

Figure 11A:
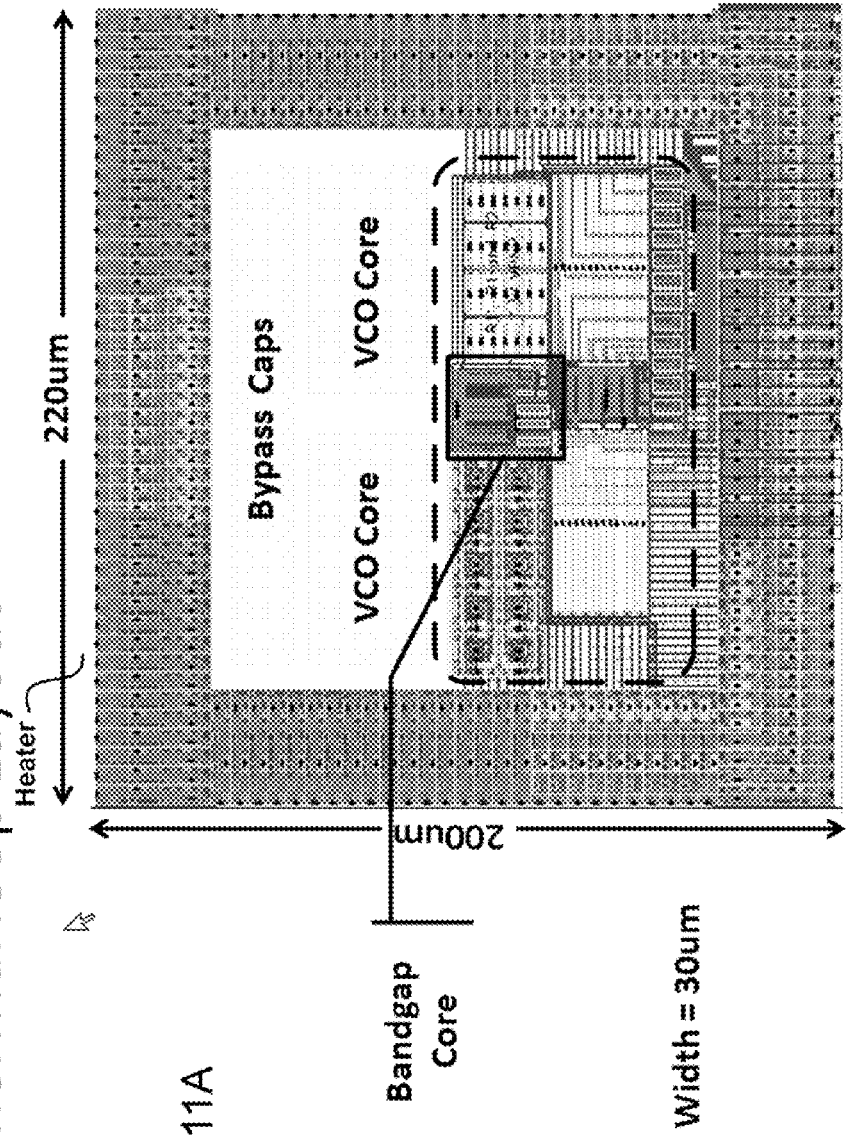
FIG. 11A is a diagram that illustrates the layout of the heater and the temperature controlling circuit in a rectangular structure.

FIG. 11A shows the layout of the heater together with the temperature controlling circuit. In the embodiment shown in FIG. 11A, the length of the heater is 220 µm. The height of the heater is 200 µm. The width of the heater ring is 30 µm. The rectangular loop structure of the heater cells provides sufficient temperature homogeneity. The sensing/controlling circuit is placed in the middle of the heater to accurately measure the temperature. The temperature profile simulation results are shown in FIG. 11B, FIG. 12, FIG. 13 and FIG. 14.

Figure 11B:
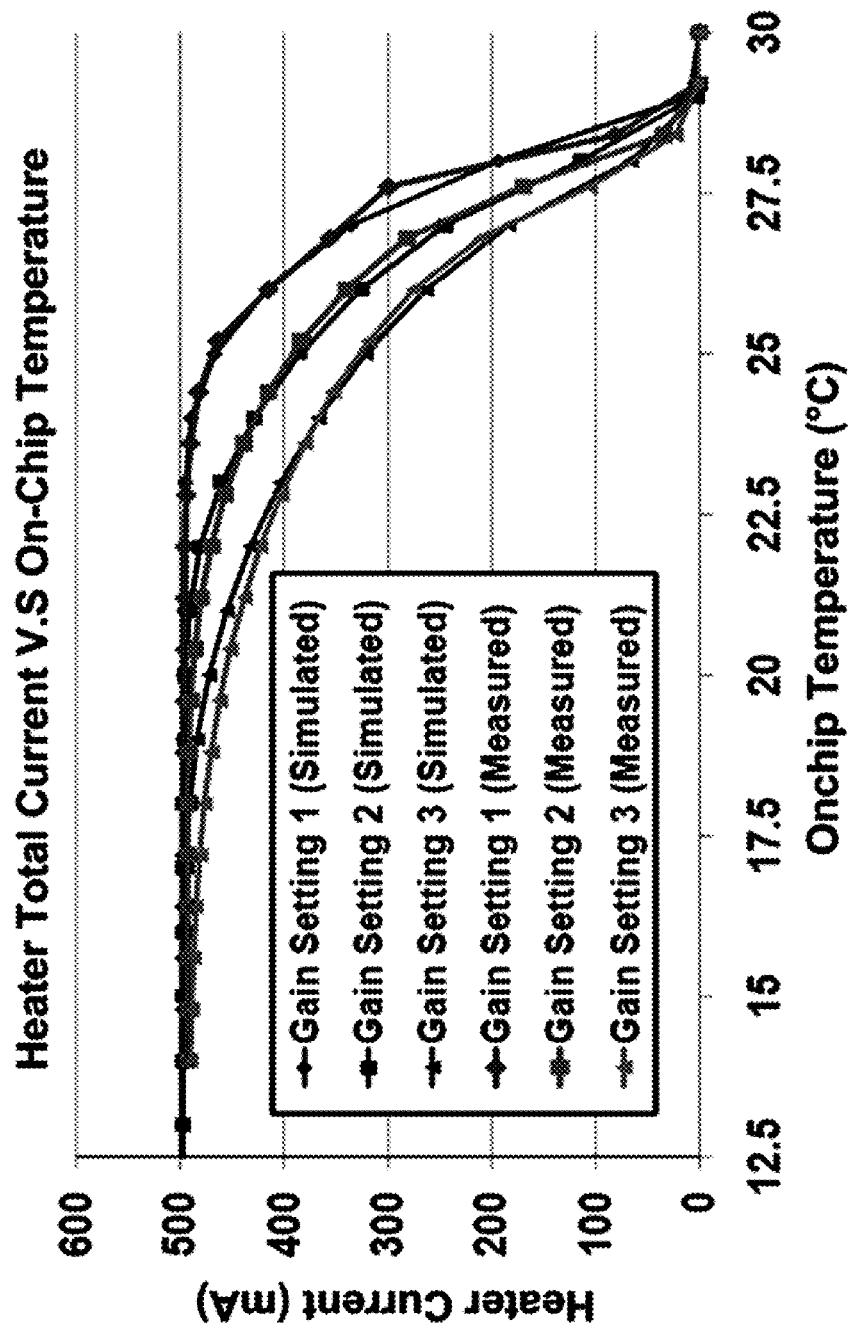
FIG. 11B shows a graph of CMOS on-chip heater response measurements for the CMOS temperature controller of FIG. 11A.

FIG. 11B shows a graph of CMOS on-chip heater response measurements for the CMOS temperature controller of FIG. 11A.

Figure 12:
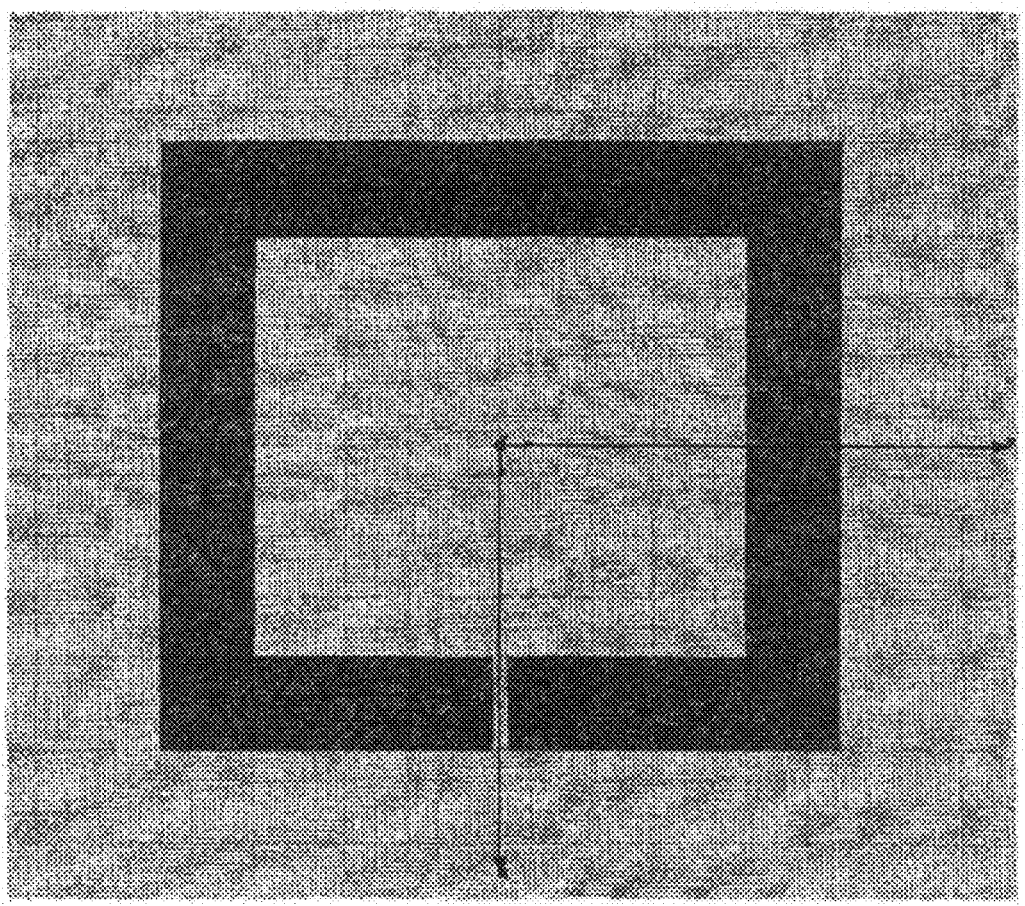
FIG. 12 is a diagram that illustrates the finite element mesh of the heater ring.

FIG. 12 is a diagram that illustrates the finite element mesh of the heater ring.

FIG. 13 is a diagram that includes FIG. 13A that illustrates the temperature profile of the heater ring with the ambient temperature of 27° C. and heater power of 350 mW. The plotting temperature range is 43.5° C. to 50° C. as shown in FIG. 13B.

FIG. 14 is another diagram that includes FIG. 14A that illustrates the temperature profile of the heater ring with the ambient temperature of 27° C. and heater power of 350 mW. The plotting temperature range is 47.5° C. to 48.5° C. as shown in FIG. 14B. As shown in FIG. 14, the temperature difference within the heater ring is less than 0.9° C.

Figure 15:
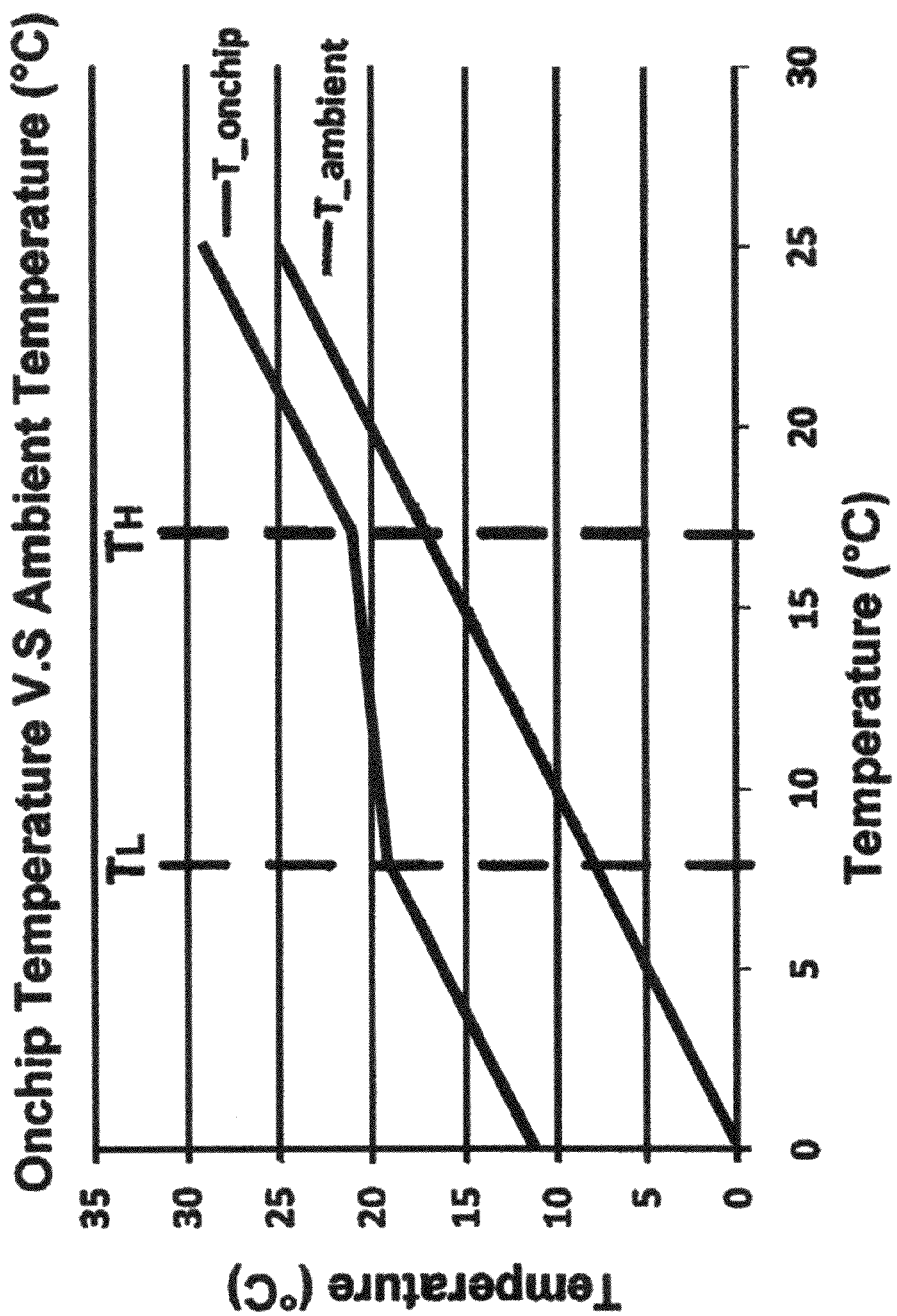
FIG. 15 is a graph that shows the estimated on-chip temperature vs. ambient temperature.

FIG. 15 is a graph that shows the estimated on-chip temperature vs. ambient temperature.

Temperature Control for a Magnetic Particle Sensor Array

To stabilize the long-term frequency behavior of a magnetic particle sensor array CMOS chip against ambient temperature change, an on-chip temperature controller can be implemented using a PTAT circuit voltage as the temperature sensor, a power PMOS array as the heater/actuator, and a bandgap voltage circuit as a temperature-independent reference to compare with the PTAT voltage. For example, in one exemplary configuration, the bandgap core was placed in close proximity of the oscillator active devices to achieve more accurate temperature sensing, while the power PMOS array surrounded the oscillator cores to minimize the spatial temperature difference within the controller. This setup formed an overall first order electrical-thermal feedback loop which had a typical DC gain of 20.5 dB and was compensated by a dominant pole in the kHz range to ensure stability.

Fabrication Procedure

One recognizes that the devices described herein require power to perform the control and heating functions. Therefore, one possible fabrication procedure that can be envisioned would include beginning with a silicon wafer or a silicon-on-insulator (SOI) wafer and laying out and building one or more control circuit array elements each comprising the temperature sensor 1, the temperature reference 2, and the temperature to electrical signal amplifier 3, along with the necessary power and control traces needed to operate each such control circuit. One would then deposit a thin insulating layer, such as a few nanometers of silicon oxide or other desired insulator over the array and the power and control traces and define therein or thereon the locations of the heater elements and the locations of openings to electrically connect the heater elements to the control circuits. One would then deposit the heater elements, for example using metal such as tungsten having a positive temperature coefficient of resistance, and provide the interconnects between the control circuits and the heaters.

One or more PDMS-based micro-fluidic sensor cells can be placed on top of the heater ring structure. The bottom PDMS layer is designed to be of submicron thickness, which helps to assure the close temperature tracking between the chamber and the silicon chip.

In order to operate the devices describe, one would provide suitable sources of electrical power of conventional nature, suitable sources of chemical reagents and/or biochemical materials of interest to be processed, and circuitry and input/output devices to allow a user to issue commands and to have displayed, recorded, and/or delivered the results of operation of the devices described herein. Results can include either or both of information about the reaction or materials of interest (e.g. a presence or absence of magnetic particles) that are processed by operation of the devices described, and the physical result in the form of material of interest processed by operation of the devices described.

Figure 16:
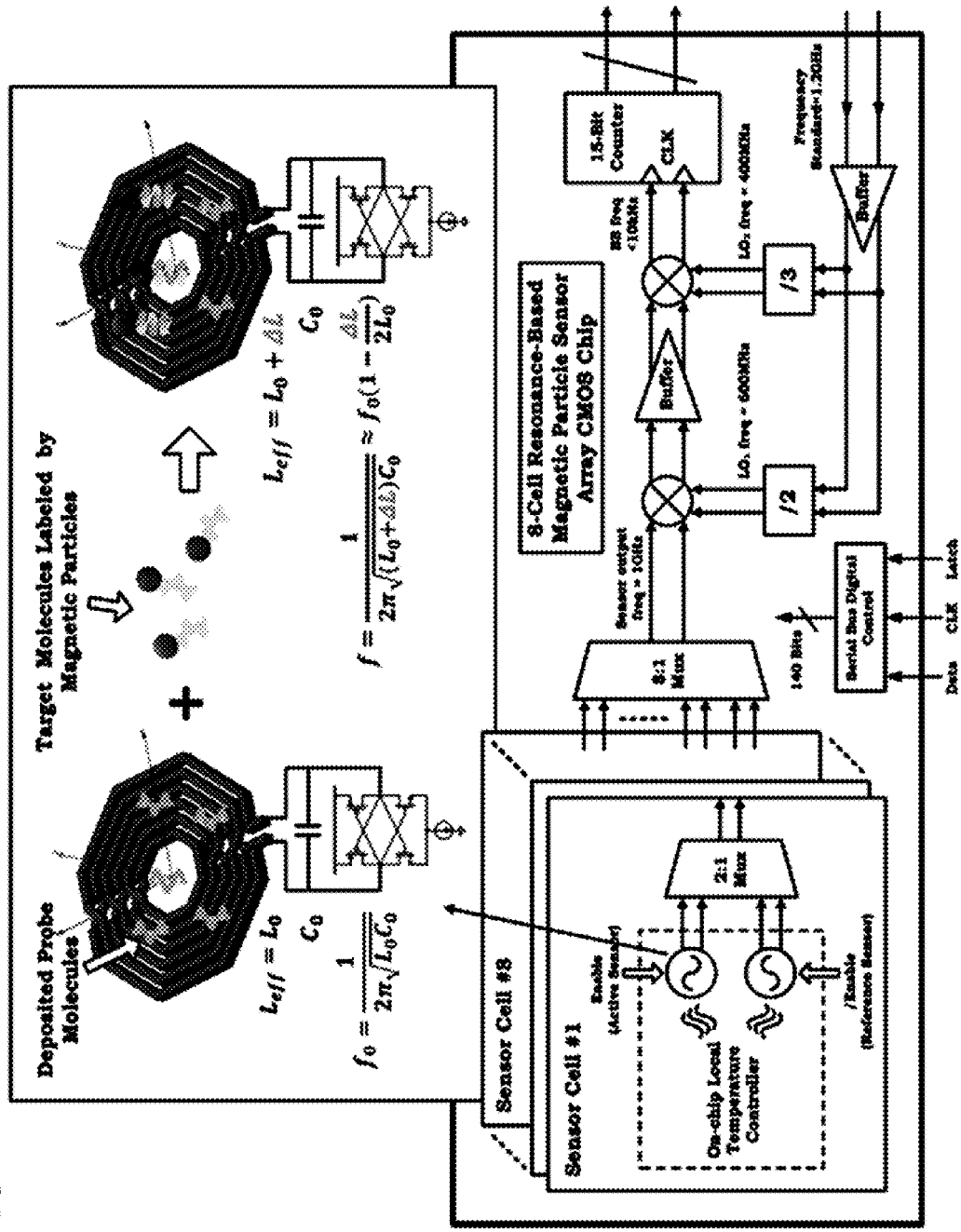
FIG. 16 shows a system block diagram of an exemplary 8-cell sensor array CMOS chip sensor array.

FIG. 16 shows a system block diagram of an exemplary 8-cell resonance based magnetic particle sensor array CMOS chip. The inventive sensing scheme includes an integrated oscillator with an on-chip LC resonator. AC electrical current flows through the on-chip inductor and generates a magnetic field which polarizes the one or more magnetic particles that are present in a sample volume). This polarization increases the total magnetic energy in the space and thereby the effective inductance of the inductor. As shown in FIG. 16, the oscillation frequency, determined by $f_v=1/(2\pi\sqrt{L_v C_v})$, downshifts (shifts to a lower frequency) due to this increased effective inductance. Our frequency-shift sensing scheme therefore needs no external magnetic field biasing and can be completely implemented in a fully planar format using a standard CMOS process to ensure a small form factor, low power, and low cost. Such a sensor scheme can also be scaled to an array on the same CMOS chip. Parallel processing can be used for testing of different bio-samples by different molecular probes to achieve large data throughputs.

In the exemplary embodiment illustrated by FIG. 16, an implemented sensor array contains eight parallel sensor cells, each of which sensor cells can be addressed independently by a digitally controlled multiplexer. Each sensor cell comprises a differential sensor pair. Each differential pair includes an active sensor oscillator and a reference sensor oscillator that share the same supply/bias (e.g. supply/bias voltages and/or currents) and local on-chip temperature controller.

The frequency shift due to a single micron-size magnetic bead is typically a few parts per million (ppm) of the resonant frequency. To facilitate accurate detection of such a small frequency shift, a downshift circuit having a two-step down-conversion architecture can be used to shift the frequency center tone to below, for example, 10 kHz. Unlike direct down-conversion, this two-step down-conversion architecture guarantees that neither of the LO signals are close to the sensor free-running frequency and hence prevents oscillator pulling or injection locking. The baseband 15-bit frequency counter therefore achieves a counting resolution of better than 0.3 Hz ($3\times10^{-4}$ ppm).

In terms of the sensor cell design, a key challenge is to achieve a stable long-term frequency behavior, i.e., low phase noise at small offset frequencies (typically below kHz), to guarantee a sub-ppm frequency variation. This phase noise behavior is generally dictated by the active device flicker noise, the on-chip temperature variations, and the supply/biasing noise, all of which are addressed by the design techniques described in more detail hereinbelow.

Ultra Low Noise Oscillator

Figure 17:
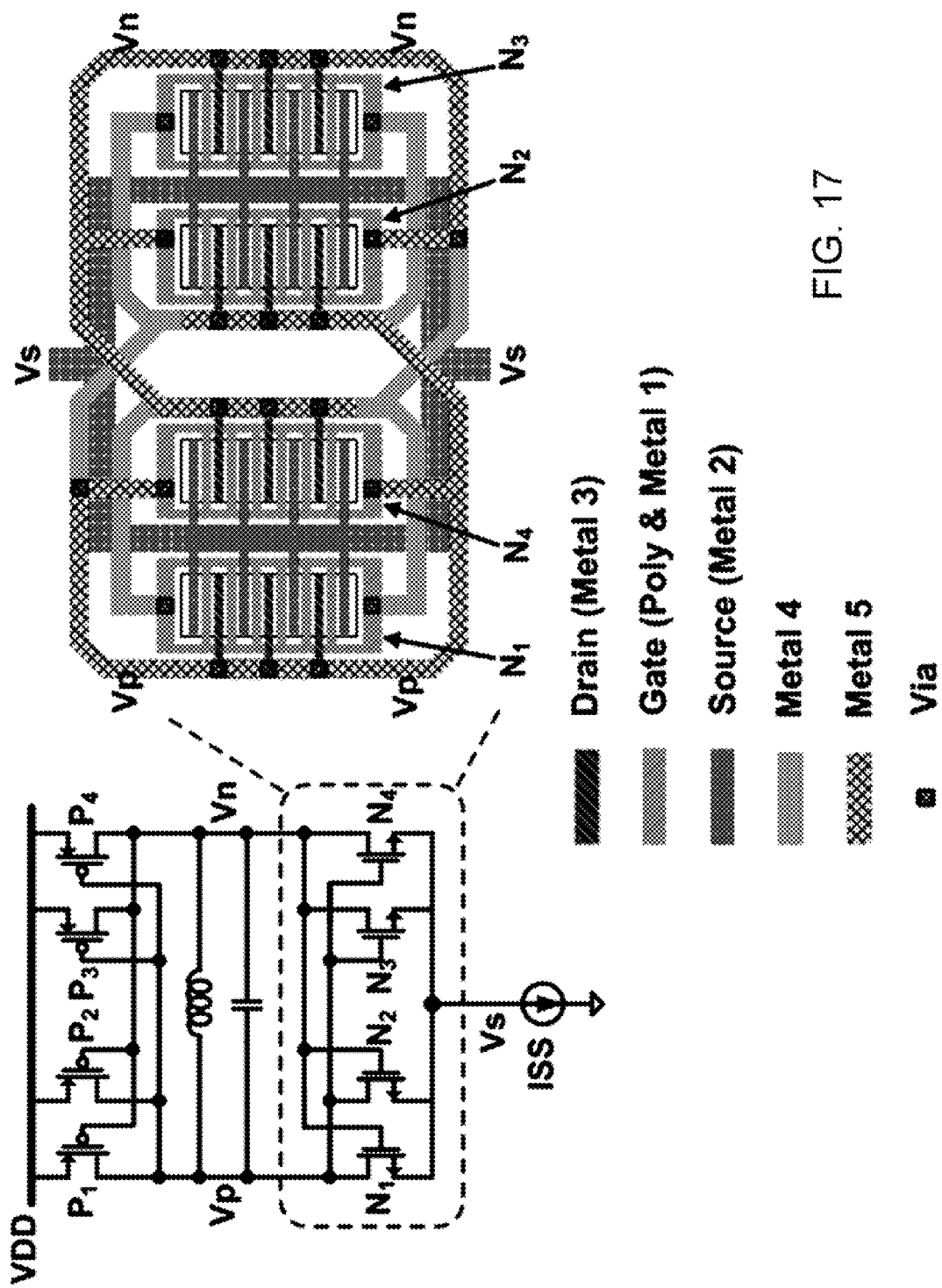
FIG. 17 shows an exemplary schematic diagram and layout of an oscillator topology suitable for use in the CMOS chip sensor array of FIG. 16.

One ultra low noise oscillator suitable for use as the sensor and reference sensor oscillator uses complementary cross-coupled pairs as the oscillator core. For example, the oscillator shown in FIG. 17 is suitable for use in a magnetic particle detector shown in FIG. 16. FIG. 17 shows an exemplary schematic diagram of an ultra low noise oscillator as well as a symmetric cross-coupled layout of a complementary cross-coupled sensing oscillator topology. To suppress flicker noise up-conversion from the tail current source, the NMOS and PMOS pairs are scaled and implemented with a symmetrical layout as shown on the right hand side of FIG. 17. Such scaling and layout can improve both the intrinsic oscillator frequency stability and robustness against process gradients.

Figure 18:
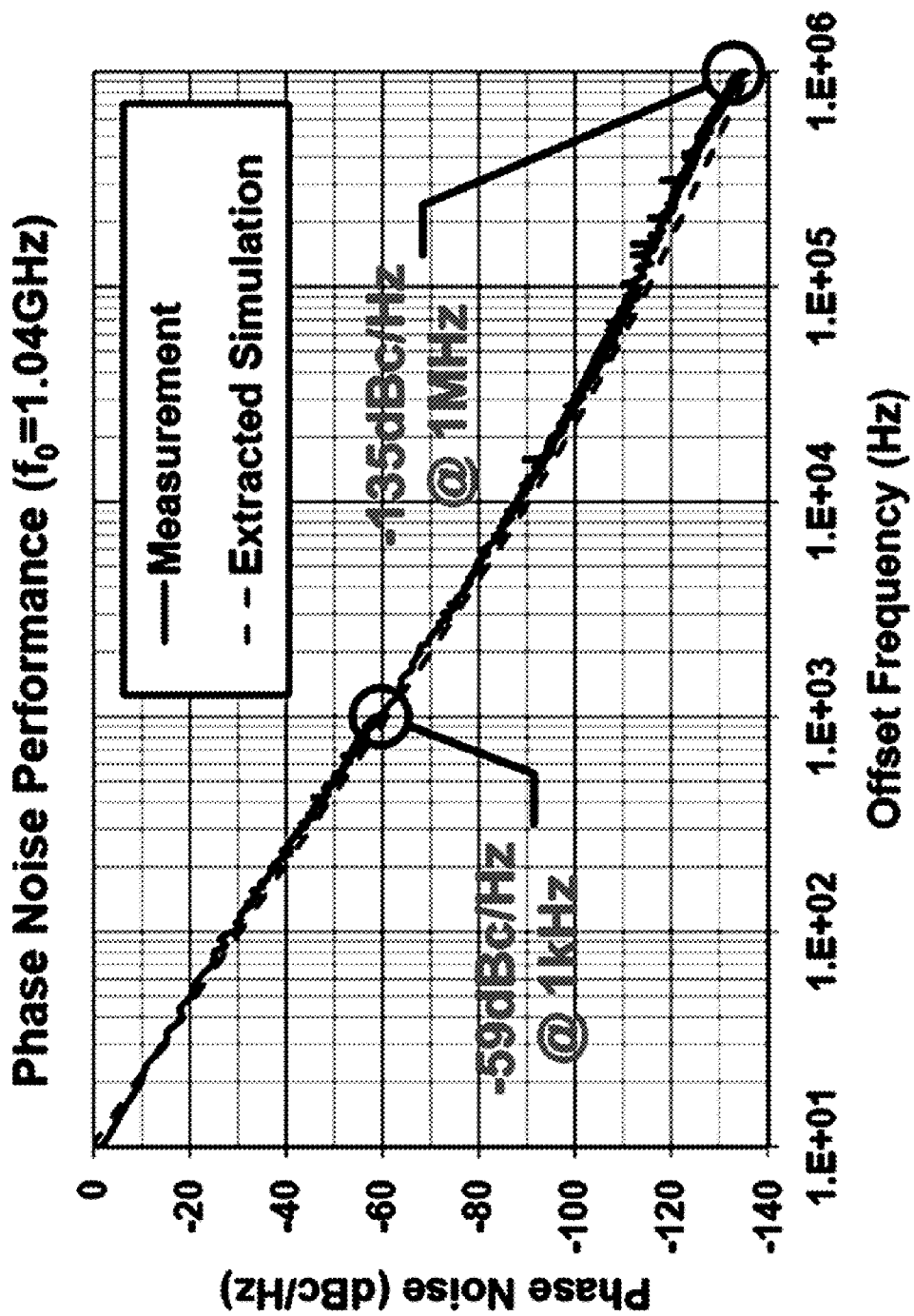
FIG. 18 shows a graph of phase noise measurement of the oscillator of FIG. 2.

FIG. 18 shows a graph of an exemplary phase noise measurement of an implemented CMOS sensor oscillator. Phase noise performance ($f_0$=1.04 GHz) is shown plotted as phase noise (dBc/Hz) plotted versus offset frequency (Hz). The implemented oscillator (which consumed 4 mA from a 1.2 V supply) achieved a phase noise of −135.1 dBc/Hz and −58.9 dBc/Hz at offset frequencies of 1 MHz and 1 kHz, respectively.

Referring back to FIG. 17, the symmetry of the cross-coupled pair is used to suppress up-conversion of the tail 1/f noise. The layout has been designed for symmetry with respect to the effects of parasitics. The exemplary detailed layout view shows a cross-coupled NMOS pair. The cross-coupled PMOS pair (not shown in the layout) can be implemented in the same way. Such layouts, including the interconnecting traces, can achieve the desired symmetry for the cross-coupled pairs.

To further suppress any low-frequency perturbations, such as supply noise, residual thermal variation, and mechanical vibration, a differential sensing scheme has been implemented. Each differential sensor pair contains a sensing and a reference oscillator, sharing the same supply/bias and on-chip temperature regulator. By alternating between the oscillators within a short time window or after a short delay (e.g., 100 ms or less) when measuring the oscillation frequency of the sensing and reference oscillators, the common-mode frequency drift can be subtracted to achieve a differential frequency standard deviation of less than 0.2 ppm.

An exemplary prototype sensor was tested with magnetic beads having diameters of 4.5 µm, 2.4 µm, and 1 µm. The results are summarized in FIG. 19A, FIG. 19B, and FIG. 19C. FIG. 19A shows a table that summarizes sensor performance for different types and sizes of magnetic beads. FIG. 19B shows an graph of typical sensor response to one Dyna-Beads® Protein G (D=2.4 µm) plotted as differential frequency shift (Hz) versus time (seconds). FIG. 19C shows an exemplary graph of Δf/f per bead (ppm) for DynaBeads® Protein G (D=2.4 µm) plotted as Δf/f per bead (ppm) versus number of beads. As can be seen, a single DynaBeads® Protein G (D=2.4 µm) with an average frequency-shift of 2.6 ppm could be readily discerned in less than a second. A long measurement of 90 seconds was performed to verify the repeatability and stability of this result. Thus, we have demonstrated that this sensor achieves the same or better sensitivity as compared with previously published schemes (e.g. using a single 2.8 µm magnetic bead), which required an external magnetic field biasing and/or an exotic post-fabrication process. We also tested nonmagnetic beads made only of polystyrene (used for structuring magnetic DynaBeads®) to verify that the sensor frequency-shift is mainly due to the increased inductance and not capacitance induced by the presence of magnetic beads.

Microfluidic Structures

Figures 20A, 20B:
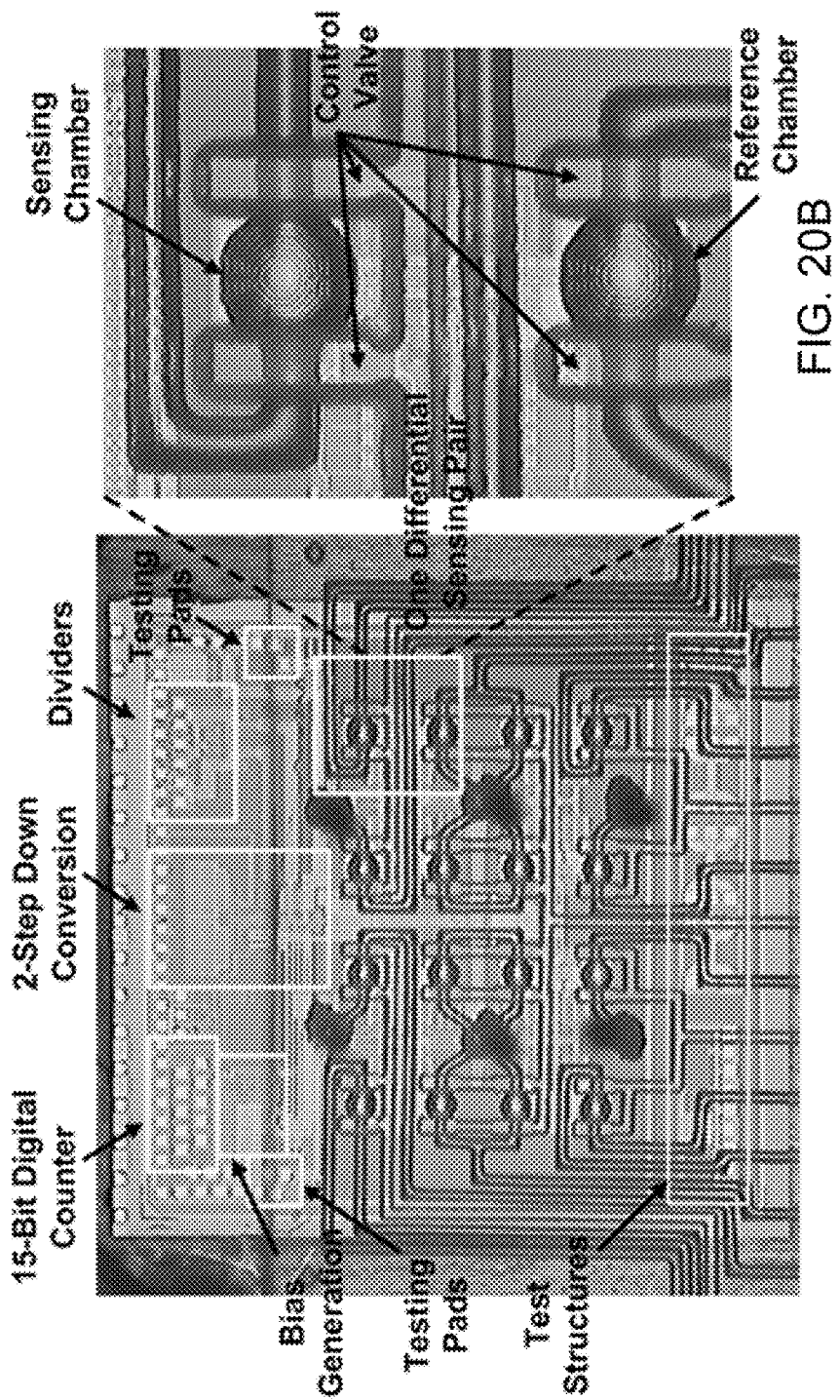
FIG. 20A shows a chip microphotograph of an exemplary CMOS frequency-shift based magnetic sensor array having an integrated micro-fluidic structure.
FIG. 20B shows a more detailed view of one differential sensing pair of sensor shown in FIG. 20A.

In some embodiments, a low-cost polydimethylsiloxane (PDMS) microfluidic structure can be fabricated and bonded to the CMOS sensor chip for applications, such as to form a complete hand-held magnetic particle sensing system. FIG. 20A shows a chip microphotograph of an exemplary CMOS frequency-shift based magnetic sensor array having an integrated micro-fluidic structure. FIG. 20B shows a more detailed view of one differential sensing pair. The microfluidic structure supports an independent and parallel feed of all eight differential sensing chambers with a sample volume of less than 0.2 nL. The achievable microfluidic channel width/separation of our PDMS fabrication facilities limited the minimum spacing of adjacent inductors to 250 µm. It is contemplated, however, that the channel width/separation can be substantially reduced by a more advanced PDMS process.

Figures 21A, 21B:
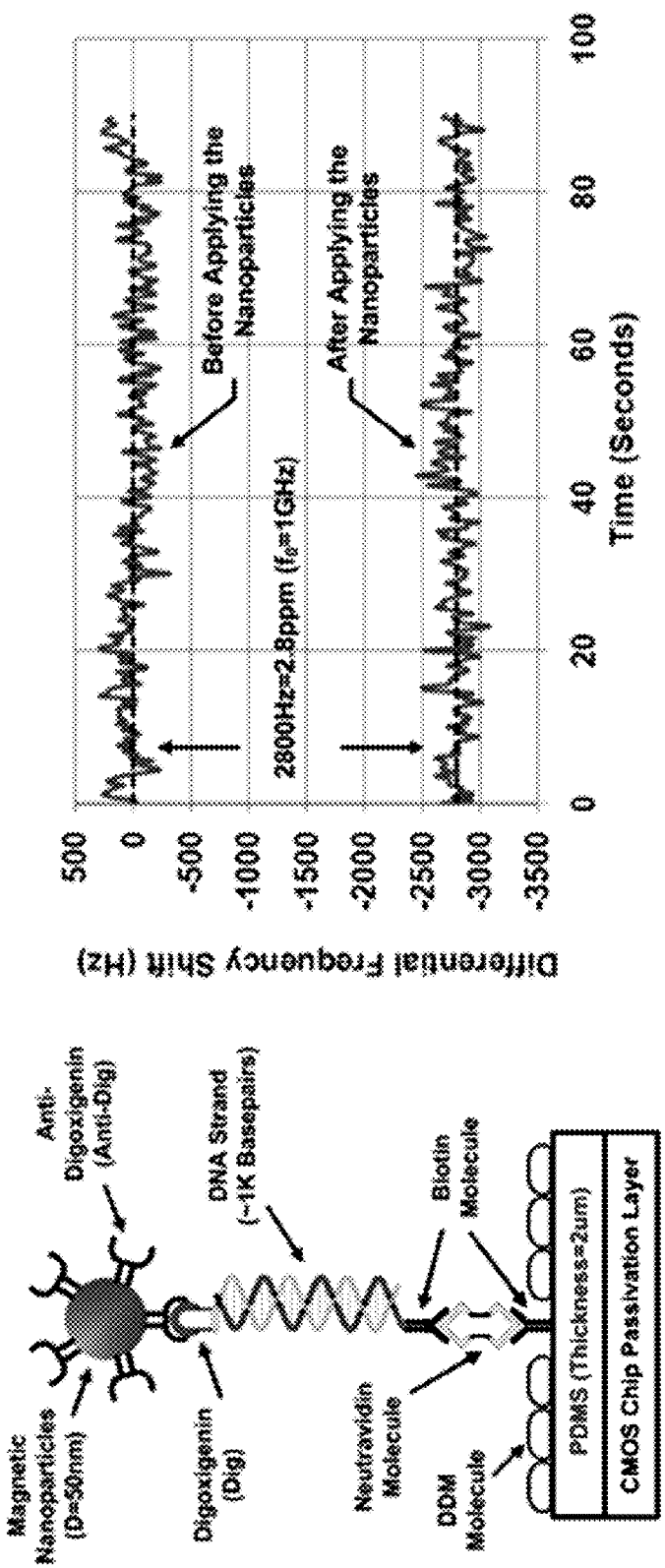
FIG. 21A shows an illustration of a 1 n molar DNA sample labeled by magnetic nanoparticles (D=50 nm).
FIG. 21B shows a graph of differential frequency shift plotted versus time (seconds) for the DNA sample of FIG. 21A.

To verify the actual bio-molecular sensing functionality, an experiment was performed on physical DNA samples using a prototype sensor. FIG. 21A shows an illustration of a 1n molar DNA sample labeled by magnetic nanoparticles (D=50 nm). FIG. 21B shows a graph of differential frequency shift plotted versus time (seconds) before and after applying the nanoparticles to the 1n molar DNA sample. Neutravidin molecules first immobilized the biotin-labeled DNA probes to the biotin modified PDMS bottom surface as has been described by Huang, et al. in "Phospholipid biotinylation of polydimethylsiloxane (PDMS) for protein immobilization," Lab on a Chip, Issue 6, pp. 369-373, June, 2006, while β-D-dodecyl-N-maltoside (DDM) molecules were used to prevent nonspecific binding between neutravidin and the PDMS surface. At the presence of the digoxigenin (dig) modified target complementary DNA strands, the antidig labeled magnetic nanoparticles (D=50 nm) were captured onto the sensor surface by the dig-antidig link. For 1n molar DNA samples (1k base pairs), the sensor reliably registered a 2.8 ppm frequency-shift as shown in FIG. 21B.

FIG. 22 shows a magnetic particle sensing scheme comparison table comparing the techniques described herein with prior art magnetic particle sensing schemes. The prototype sensor array system (labeled "This Design" in the table of FIG. 22) consumed a total power of 165 mW, and occupied about 2.95 µm×2.56 µm in 130 nm CMOS process.

Differential Sensing Scheme

During operation of a magnetic particle sensor, various types of noise, such as flicker noise, thermal white noise, etc, can appear, such as for example, at the supply and the biasing network. Moreover, due to the finite loop gain of the temperature regulator, the local on-chip temperature can fluctuate with respect to the ambient temperature. Furthermore, mechanical perturbation is also inevitable.

Factors such as those described above typically cause frequency fluctuations of the oscillator. The active sensing oscillator and the reference can be designed so that they share the same supply, biasing network, and local on-chip temperature. Therefore, the active sensing oscillator and the reference essentially are exposed to the same sources for frequency fluctuation. By alternately measuring the two oscillator's frequencies, the common frequency drift can be captured and subtracted out. The measuring time window can be optimized, so that the factors for frequency fluctuation remain unchanged for the two oscillators during the two measurements.

Figure 23:
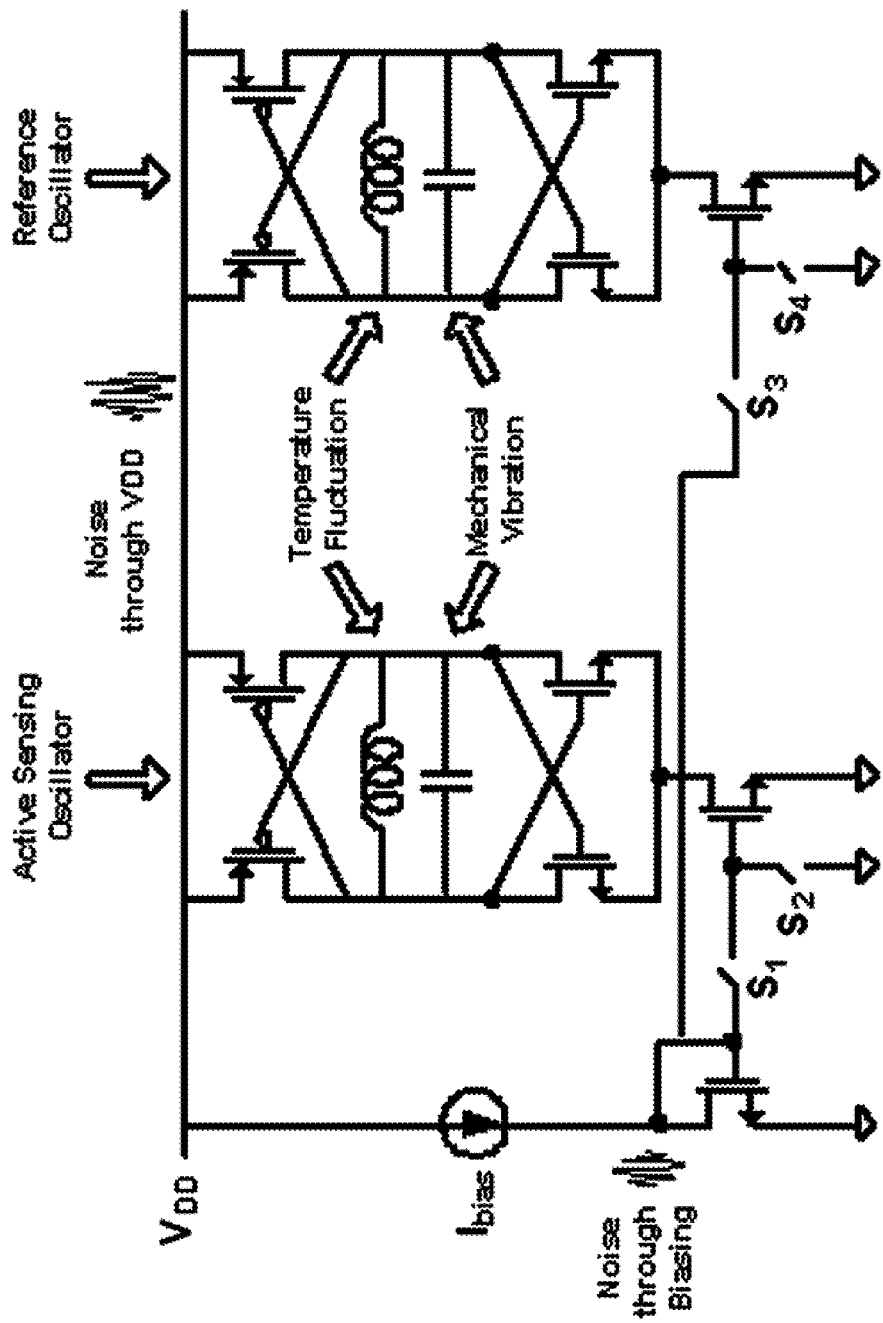
FIG. 23 shows a schematic diagram of one exemplary embodiment of a differential sensing scheme based on a complementary cross-coupled oscillator.
Figure 24:
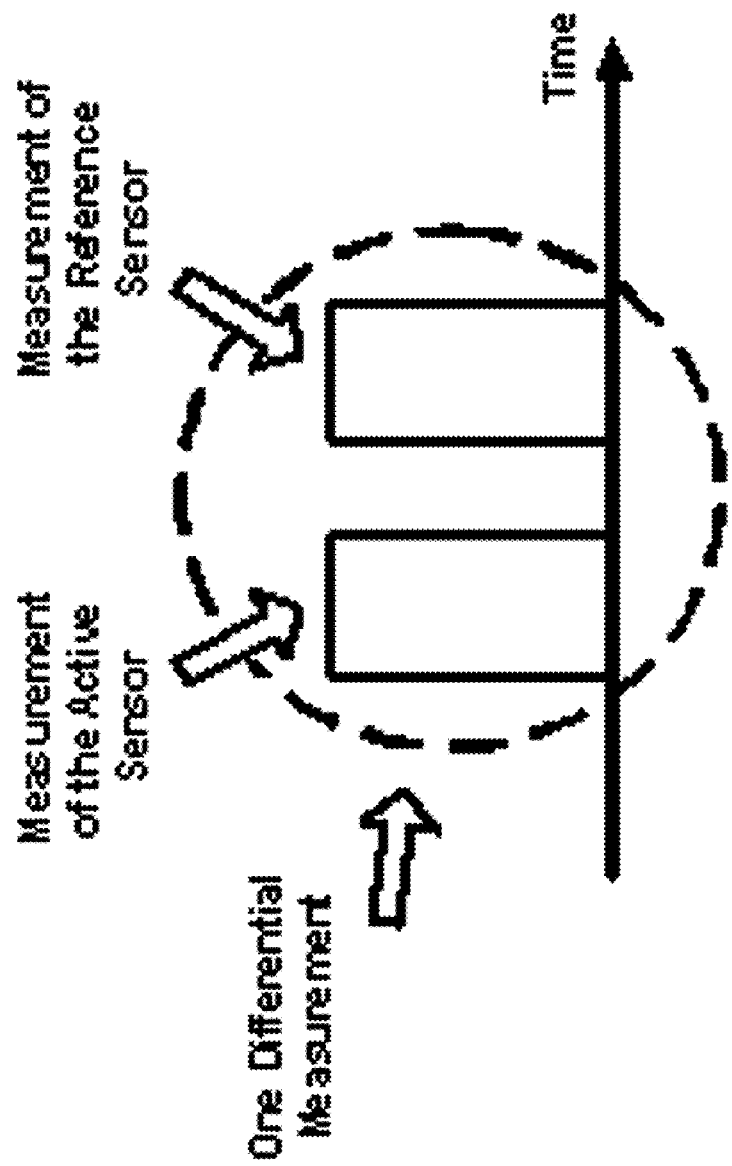
FIG. 24 shows a timing diagram for the exemplary differential sensing scheme of FIG. 23.

FIG. 23 shows a schematic diagram of one exemplary embodiment of a differential sensing scheme based on a complementary cross-coupled oscillator that was implemented for laboratory testing. NMOS current sources are used for the oscillators. Switches $S_1/S_2$ control the turning-on active sensing oscillator and switches $S_3/S_4$ control the reference oscillator. FIG. 24 shows a timing diagram of the operation of the exemplary differential sensing scheme.

In some embodiments, the two oscillators can be designed with different oscillation frequencies that are not harmonically related, so that concurrent operation of the two oscillators is possible with no oscillator pulling and injection-locking. This will provide a better rejection against the aforementioned common frequency-fluctuation factors.

Effect of Differential Sensing (Measurement)

Figure 25:
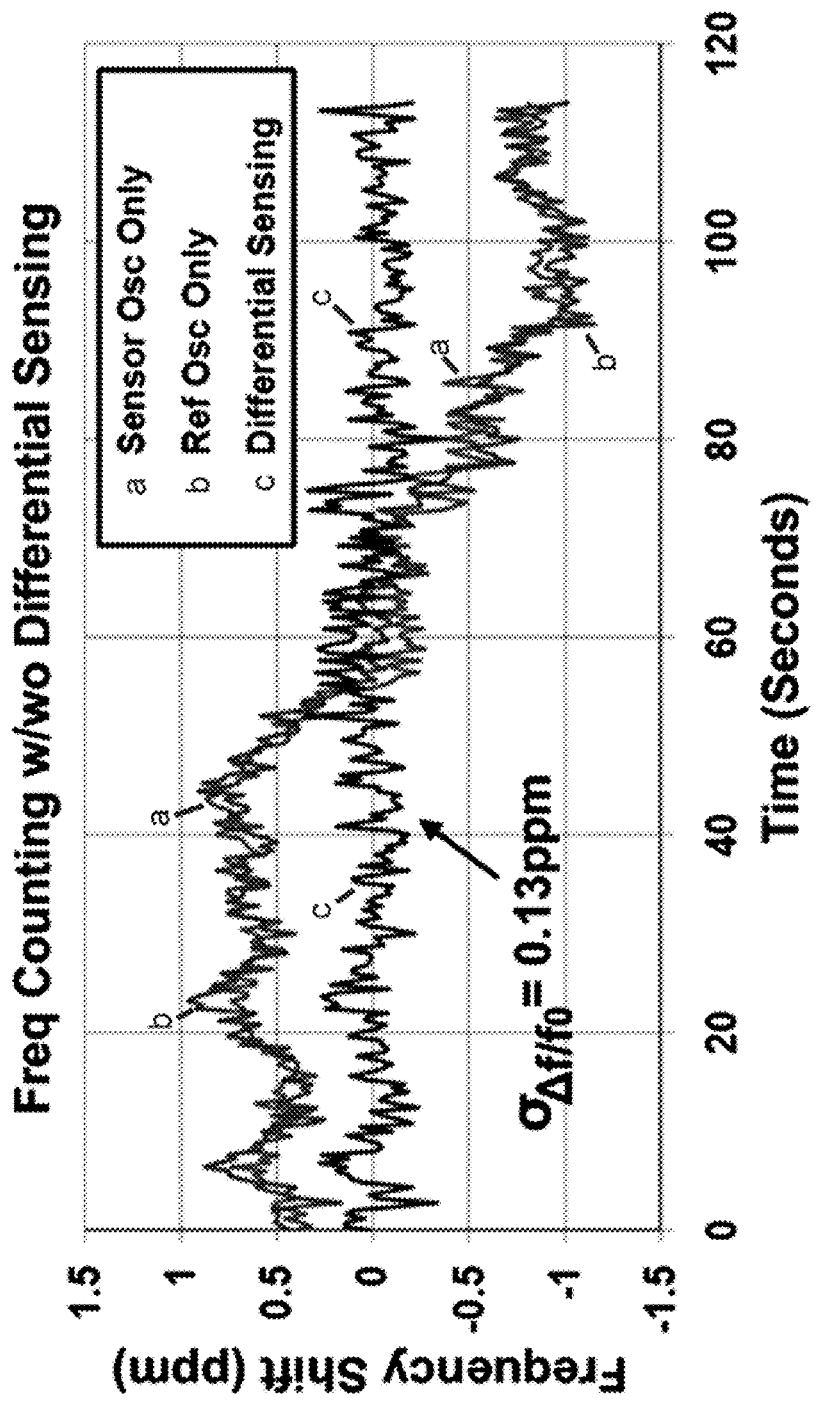
FIG. 25 shows a graph of frequency count results for a sense oscillator, a reference oscillator and differential sensing.

FIG. 25 shows a graph of frequency count results (with and without differential sensing) for a sense oscillator, a reference oscillator and differential sensing plotted as frequency shift (ppm) versus time (seconds). Frequency shift in ppm (parts per million) is shown plotted versus time in seconds. The curves "Sensor Osc Only" and "Ref Osc Only" represent the individual frequency counting results of the two sensor oscillators (the active sensor oscillator and the reference sensor oscillator) with an acquisition time of 0.1 s. Significant low-frequency drifting can be observed.

Differential sensing, i.e. performing by subtraction of the frequency counting results of the two sensors, is shown by the curve "Differential Sensing". It can be seen that the observed low-frequency drifting is greatly suppressed. The differential sensing curve shows the functionality of differential sensing scheme, which can effectively suppress any common-mode perturbation between the active sensor and the reference. Exemplary common-mode perturbations include power supply noise, temperature change, and mechanical vibration. In laboratory testing, after the differential sensing, the frequency counting standard deviation ($\sigma_{\Delta f/f_0}$) was measured as 0.13 ppm before averaging. To achieve good suppression of common-mode noise using the techniques described hereinabove, the active sensing oscillator and the reference can be designed to share the same supply, biasing network, and local on-chip temperature.

Figure 26A:
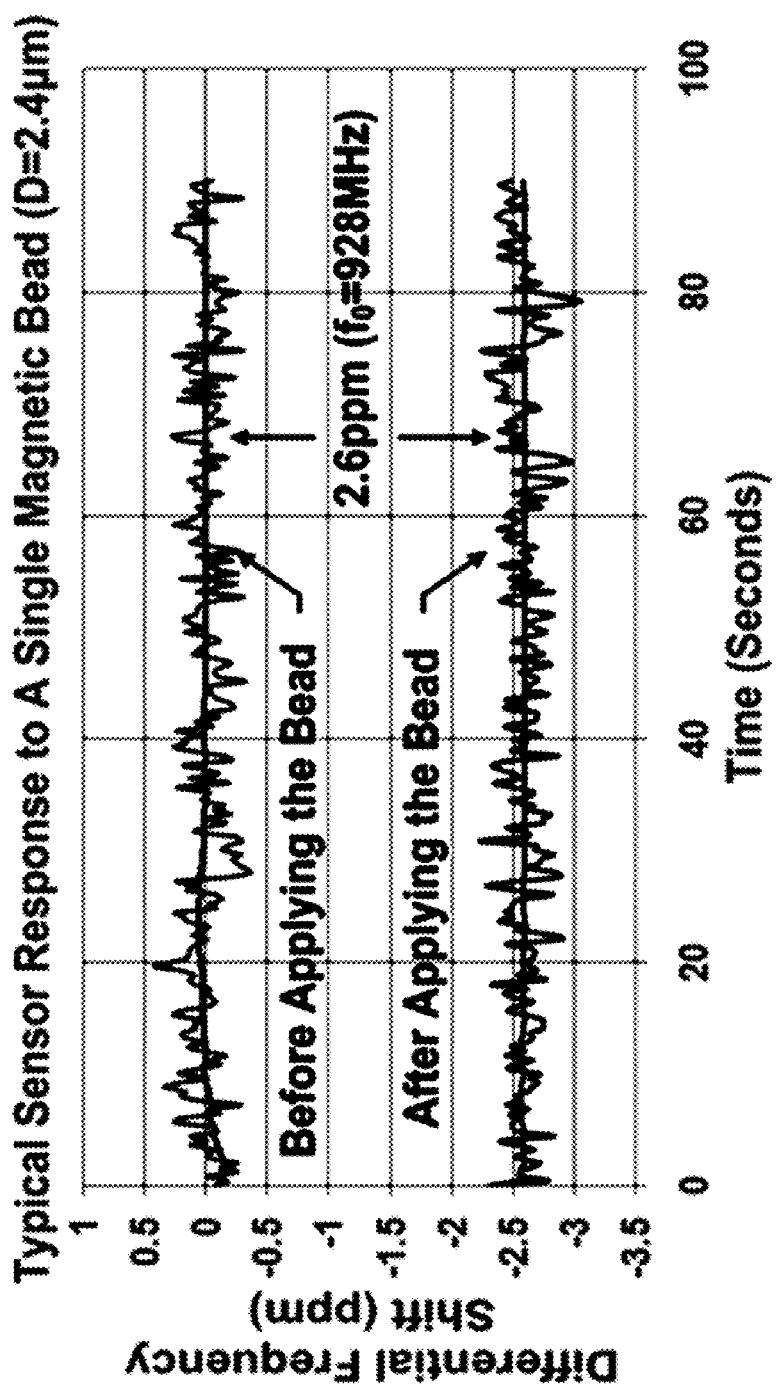
FIG. 26A shows a graph of sensing results for a magnetic bead with a 2.4 μm diameter.

FIG. 26A shows a graph of sensing results for a magnetic bead with a 2.4 μm diameter plotted as frequency shift (ppm) versus time (seconds). Typical sensor response to a single magnetic bead (D=2.4 μm) is shown as differential frequency shift (ppm) plotted against time in seconds. The df/f per bead is around 2.6 ppm. One single 2.4 μm bead can be detected.

Figure 26B:
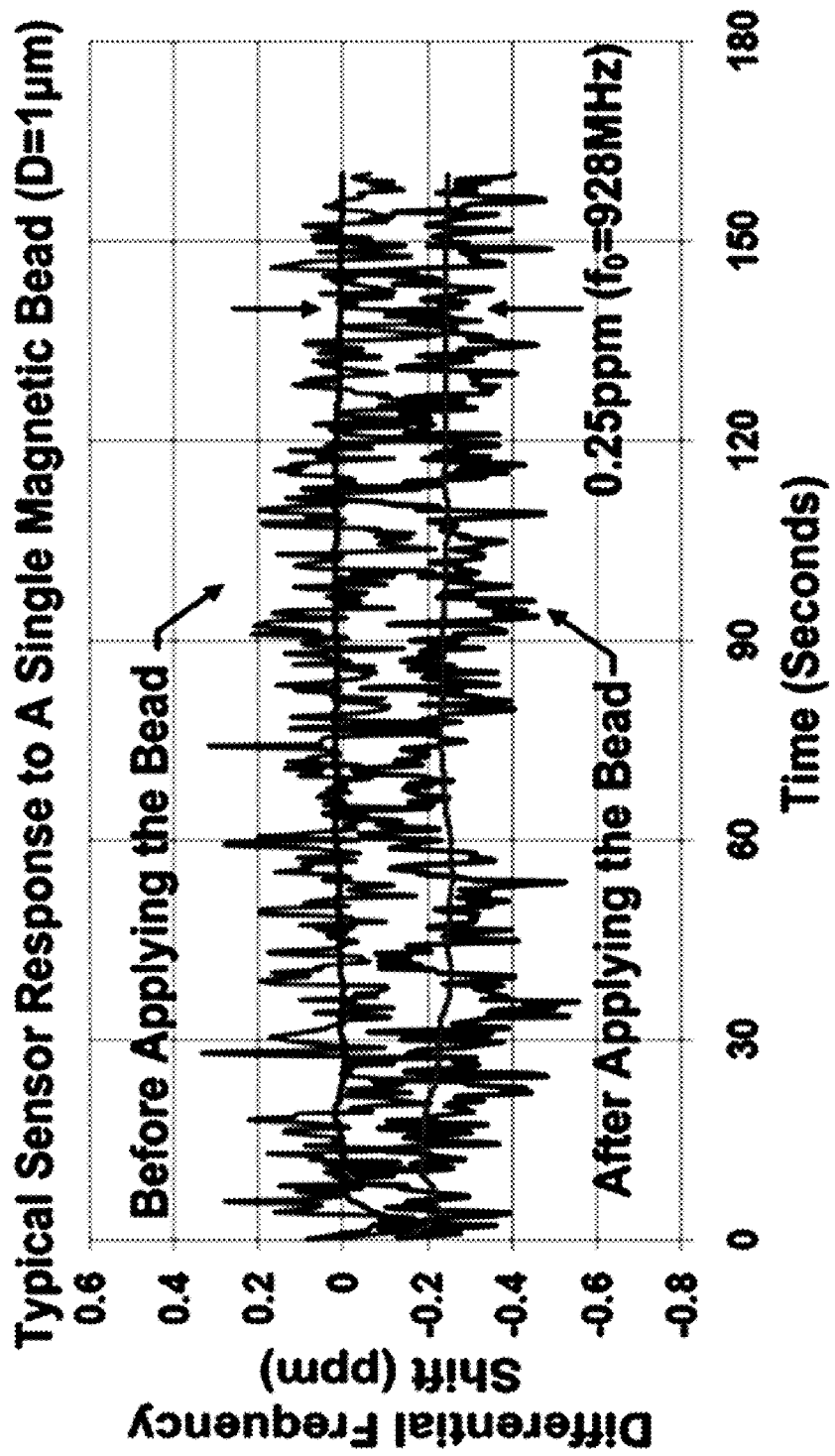
FIG. 26B shows a graph of sensing results for a magnetic bead with a 1 μm diameter.

FIG. 26B shows a similar graph of sensing results for a magnetic bead with a 1 μm diameter. Here, typical sensor response to a single magnetic bead (D=1 μm) is shown as differential frequency shift (ppm) plotted against time in seconds. The df/f per bead is around 0.25 ppm. One single 1 μm bead can be detected.

Figure 28:
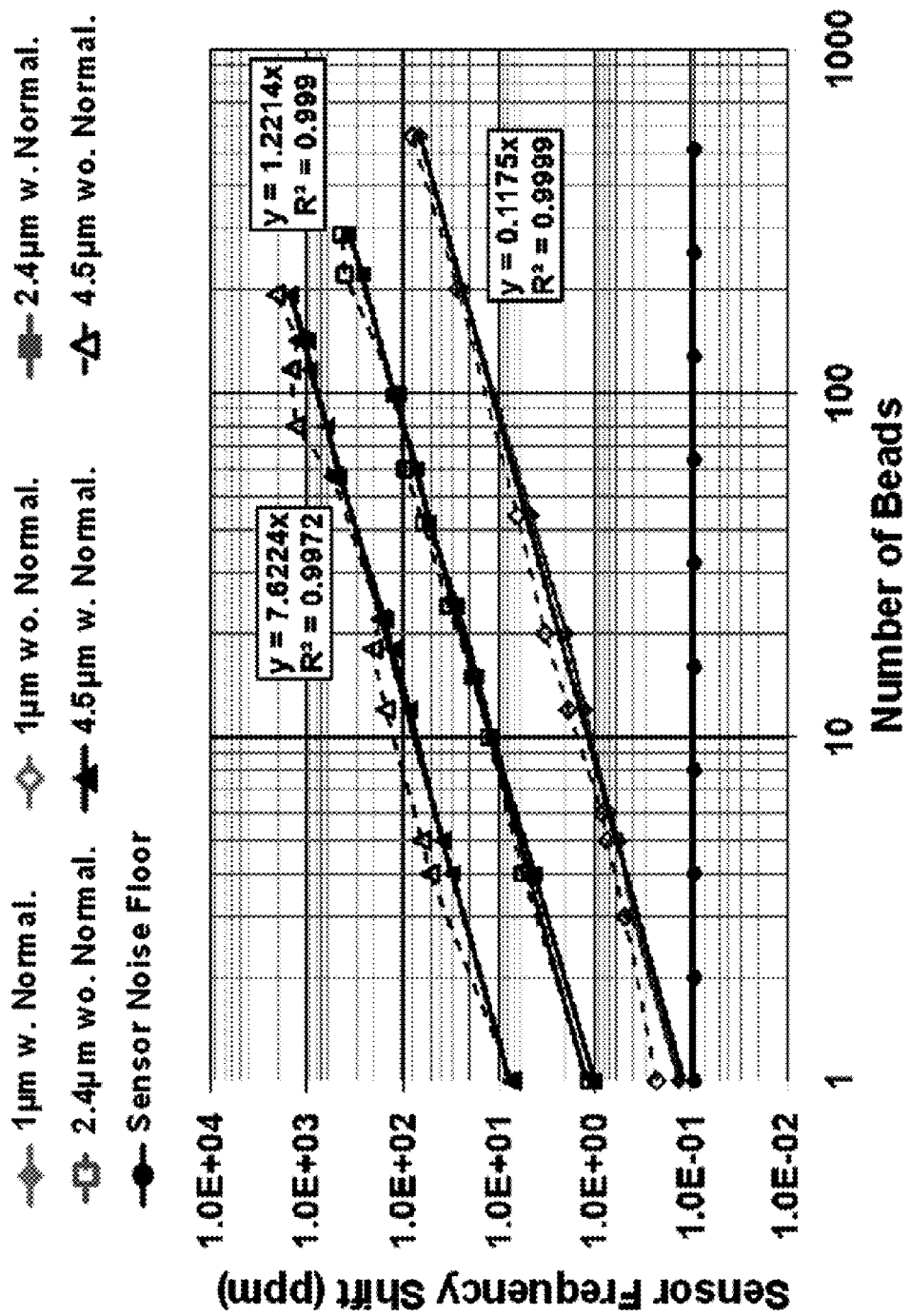
FIG. 28 shows a graph of measured sensor response for different types of magnetic beads with and without normalization.

FIG. 27 shows a table of typical sensor response to magnetic beads of various types and diameters. FIG. 28 shows a graph of measured sensor response for different types of magnetic beads with and without normalization. In the graph of FIG. 28, sensor frequency shift (ppm) is plotted versus the number of beads present in a sample. Where, with normalization ("w. Normal.") and without normalization ("wo. Normal.") are defined as with and without normalization, respectively. The normalization process included: 1) recording the positions of the attached beads, and 2) scaling the total sensor response as if all the attached beads are located at the center of the sensing inductor based on the theoretically calculated position-dependent sensor response. This data reveals that if the sensor inductor has a uniform sensing response, the sensor scheme can achieve an at least $10^4$ dynamic range. Such relatively high dynamic ranges can be achieved through inductor design and/or specifically depositing molecular probes at the sensor locations which have an equal sensitivity (e.g. at the center or with some donut shape.)

EXAMPLE

Figure 29:
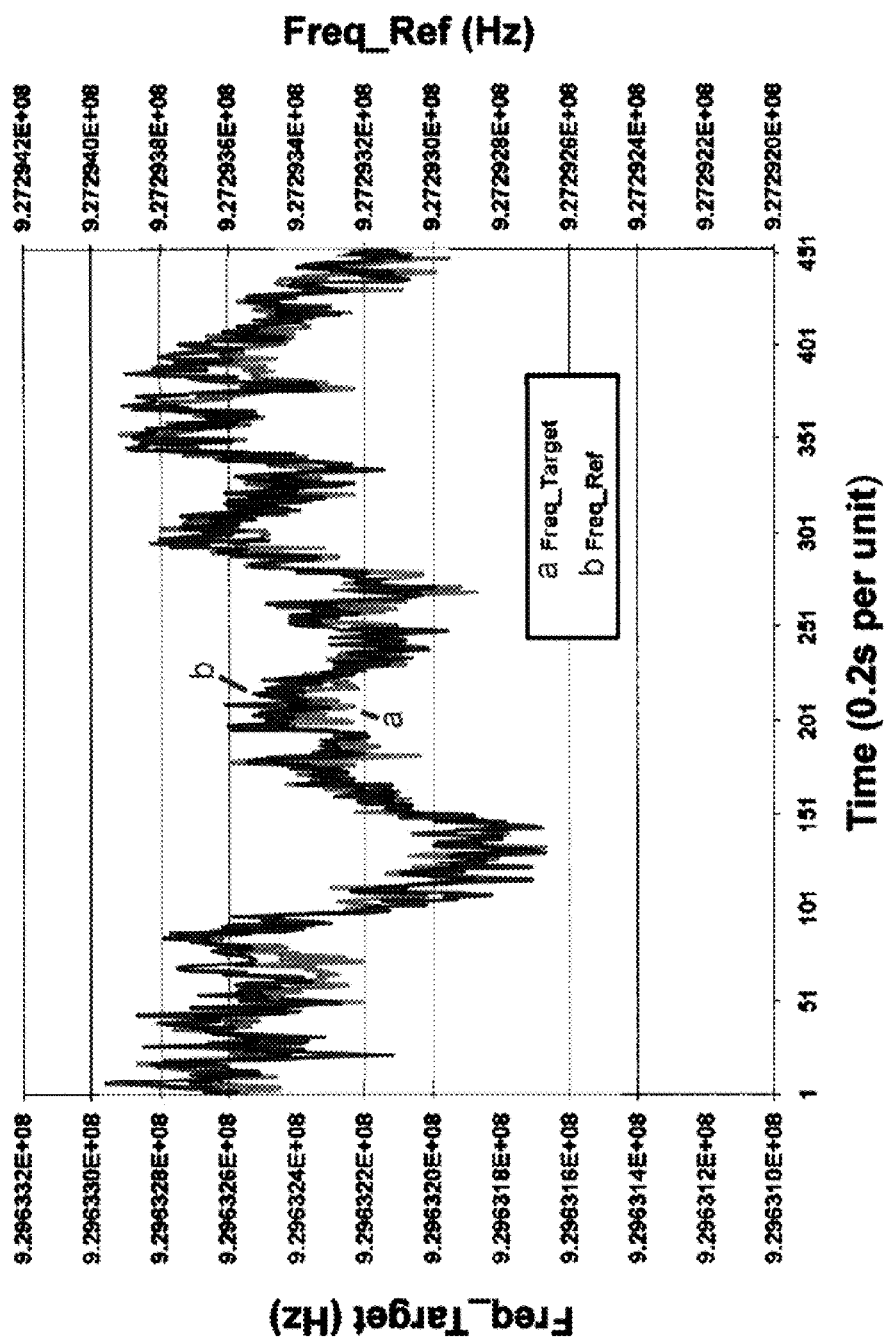
FIG. 29 shows an exemplary graph of frequency (Hz) plotted versus time for one exemplary prototype sensor.

Turning now to experimental results from one exemplary test setup, FIG. 29 shows a graph of frequency (Hz) plotted versus time (0.2 seconds/unit) for alternate frequency counting of two sensors, a target or active sensor and a reference sensor. The alternate frequency counting was done for the active sensor (Freq_Target) and the reference sensor (Freq_Ref) with an acquisition time of 0.1 s for every count. Significant frequency drifting can be seen.

Figure 30:
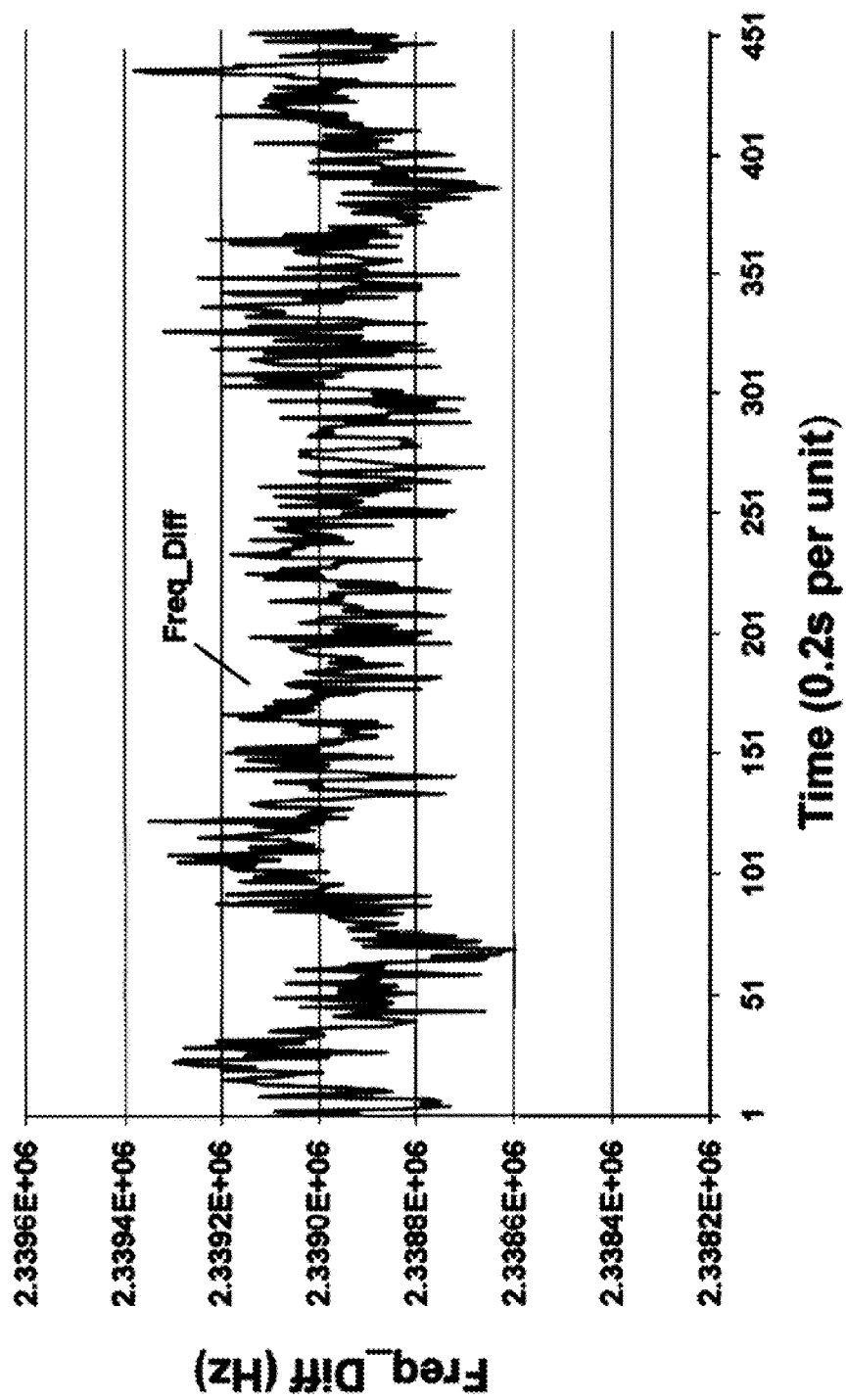
FIG. 30 shows an exemplary graph of differential sensing.

FIG. 30 shows a graph of differential sensing (performing subtraction of the frequency counting results of the two sensors) plotted as frequency difference (Freq_Diff) in Hz versus time (0.2 s per unit). It can be seen that the common frequency drift (e.g. as shown in FIG. 29) is greatly suppressed. This shows how the differential sensing scheme can effectively remove common-mode perturbations between the active sensor and the reference sensor, including such perturbations as power supply noise, temperature change, mechanical vibration, and other perturbations.

Figure 31:
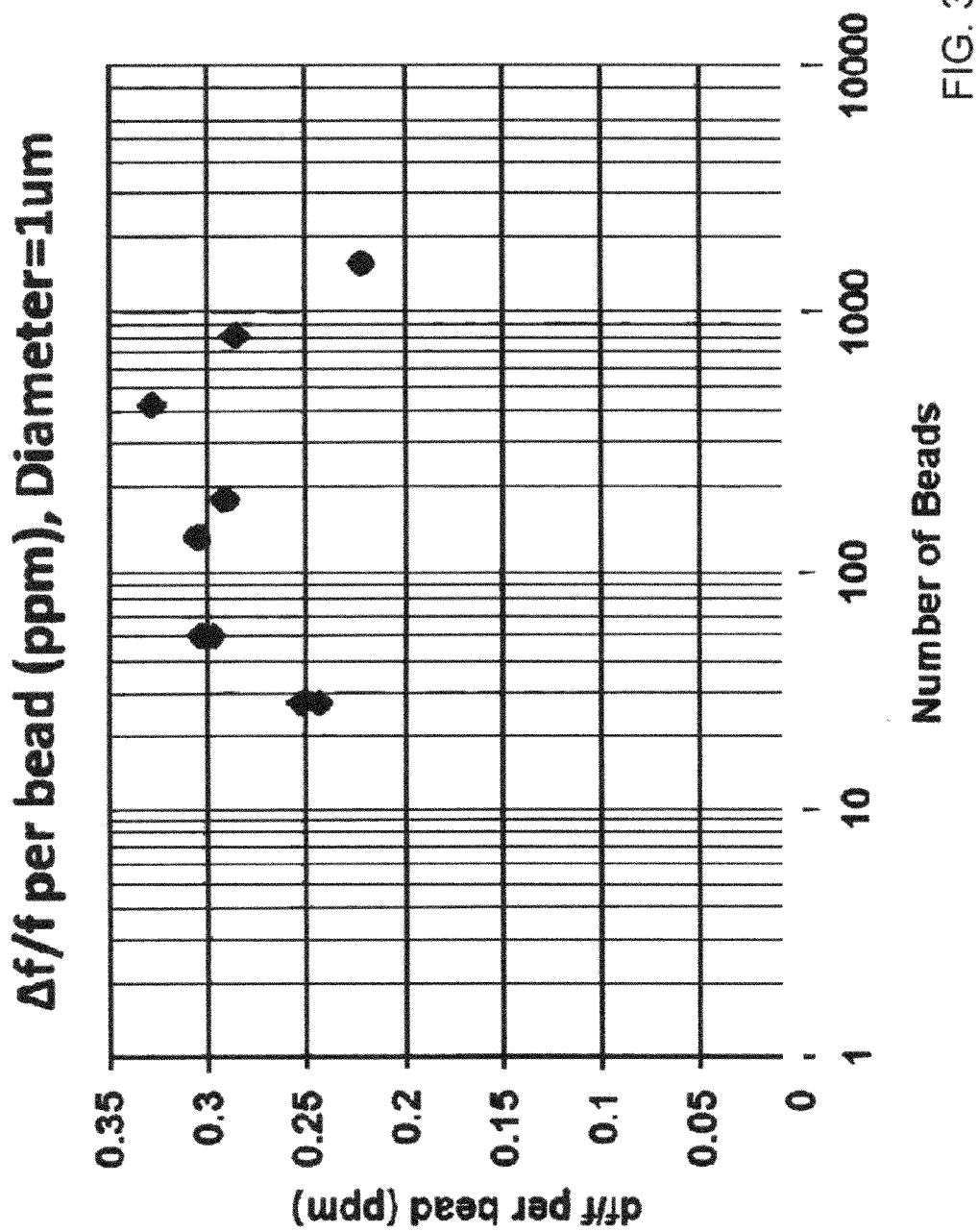
FIG. 31 shows a graph of Δf/f per bead (ppm) for magnetic beads with a 1 μm diameter.
Figure 32:
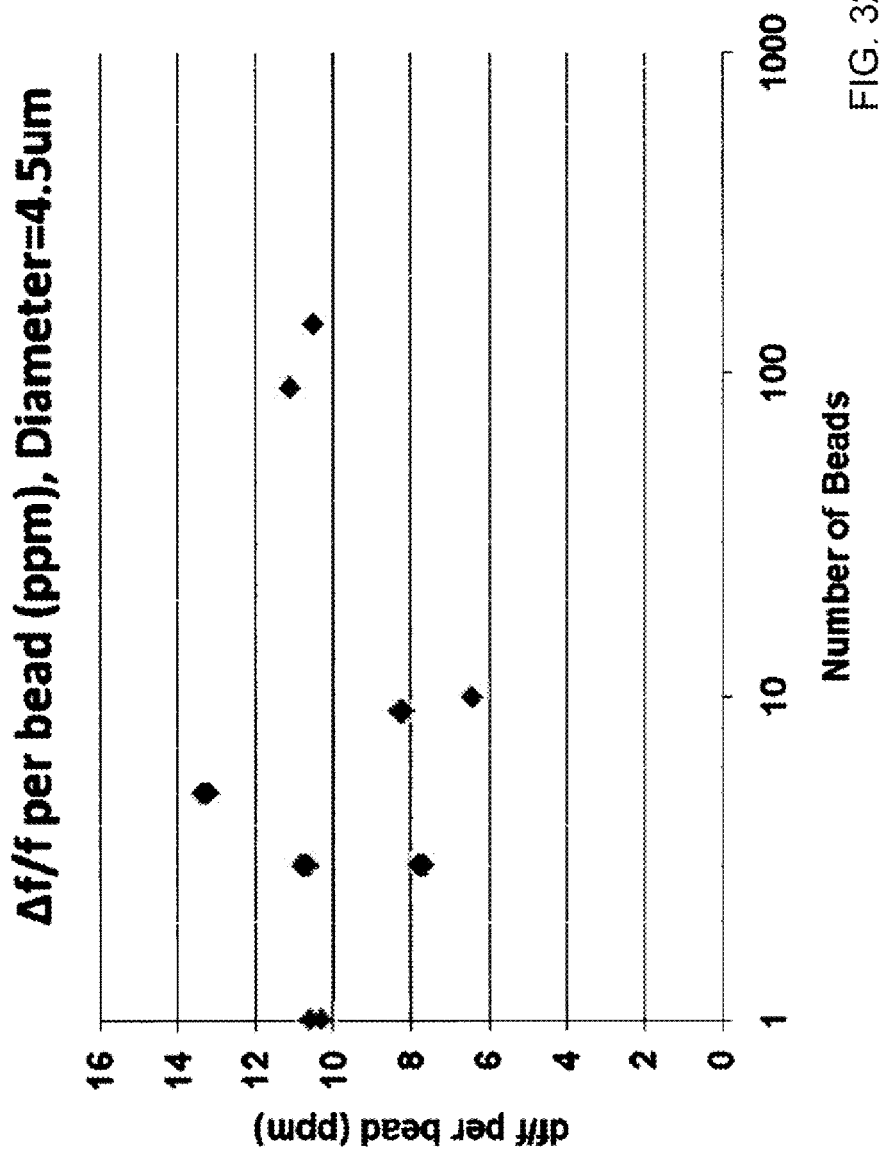
FIG. 32 shows a graph of Δf/f per bead (ppm) for magnetic beads with a 4.5 μm diameter.
Figure 33:
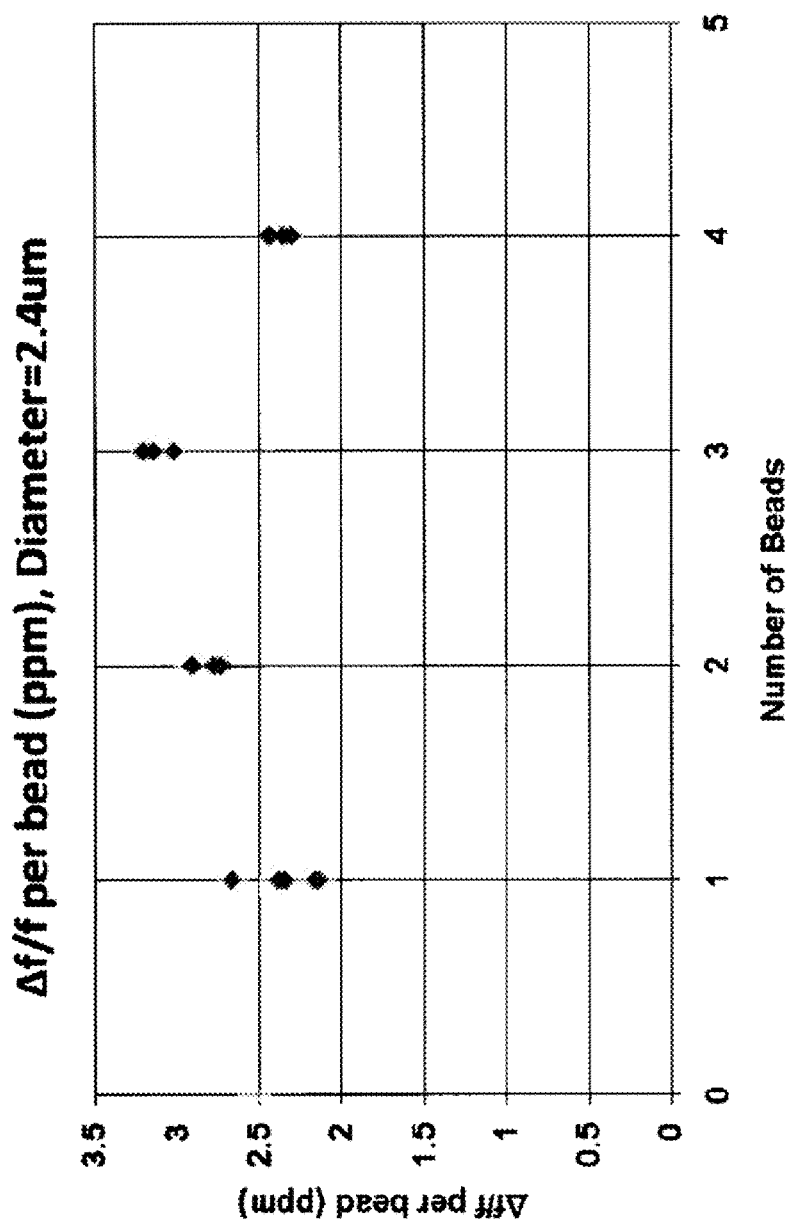
FIG. 33 shows a graph of Δf/f per bead (ppm) for magnetic beads with a 2.4 μm diameter.

FIG. 31 shows a graph of Δf/f per bead (ppm), plotted as df/f per bead (ppm) versus the number of beads present in a sample volume. These sensing results for magnetic beads with a 1 μm diameter show that the df/f per bead was measured to be about 0.2 ppm to about 0.35 ppm. A bead number as small as 27 was detectable. FIG. 32 shows a graph of Δf/f per bead (ppm) for magnetic beads with a 4.5 μm diameter. The df/f per bead was measured to be about 6 ppm to about 14 ppm. A single 4.5 μm diameter bead was easily detected. FIG. 33 shows a graph of Δf/f per bead (ppm) for magnetic beads with a 2.4 μm diameter. The df/f per bead was measured to be about 2 ppm to about 3.5 ppm. A single 2.4 μm diameter bead was easily detected.

For the experimental data of the example described above, the standard deviation (std) is no larger than 0.36 ppm for this differential frequency counting measurement (with frequency sample number of 350). Note that this std is for total frequency shift. Therefore, the variation of Δf/f per bead tends to be larger for smaller bead number. The average Δf/f per bead is not exactly the same among the measurements with different number of beads. This is because sensor sensitivity is location dependent on the inductor. But we can see the sensitivity ranges around 2 ppm/bead to 3.5 ppm/bead. In reality, this is not an issue, since we can specifically deposit the DNA probe molecules to the locations with equal sensitivity (such as by using a donut shape). The measured total differential frequency offset drifting between the two oscillators was found to be about 2 ppm/day (possibly due to aging), thus providing a meaningful measurement (e.g. over 5 minutes).

Exemplary CMOS Structure

Figure 34:
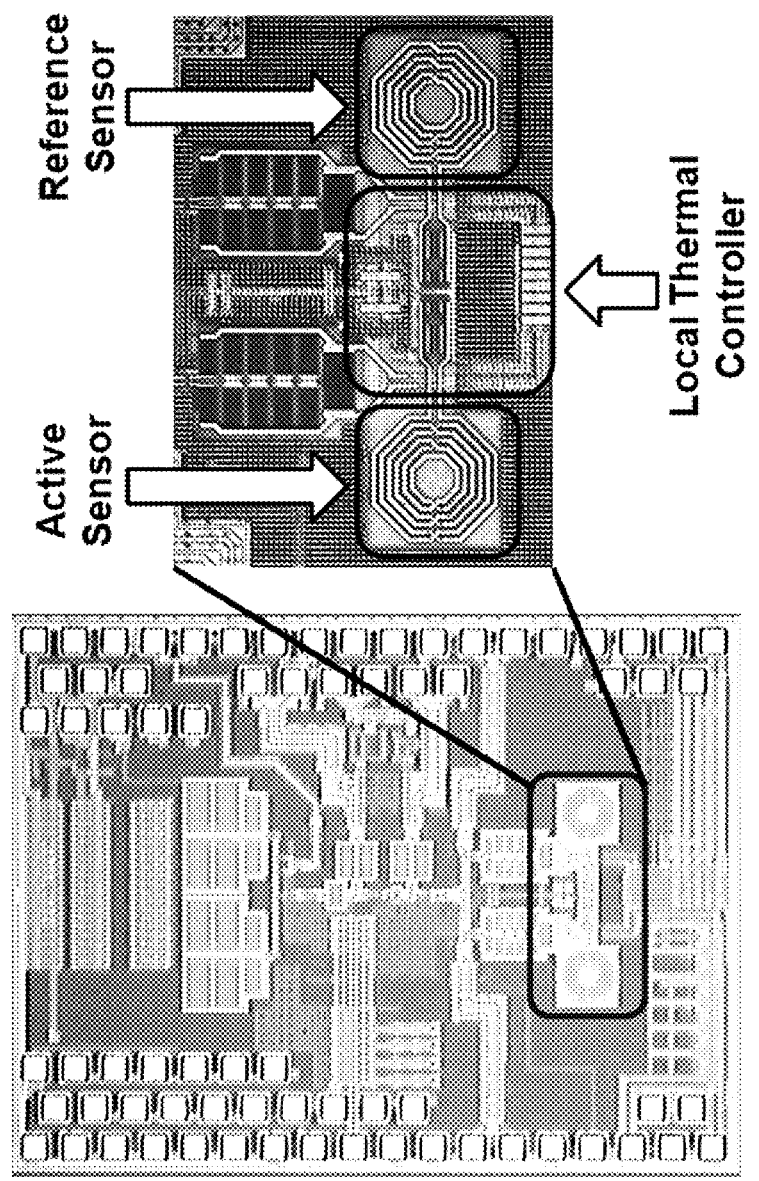
FIG. 34 shows an illustration of one cell of a magnetic particle sensor implemented in a 130 nm standard CMOS process.
Figure 35:
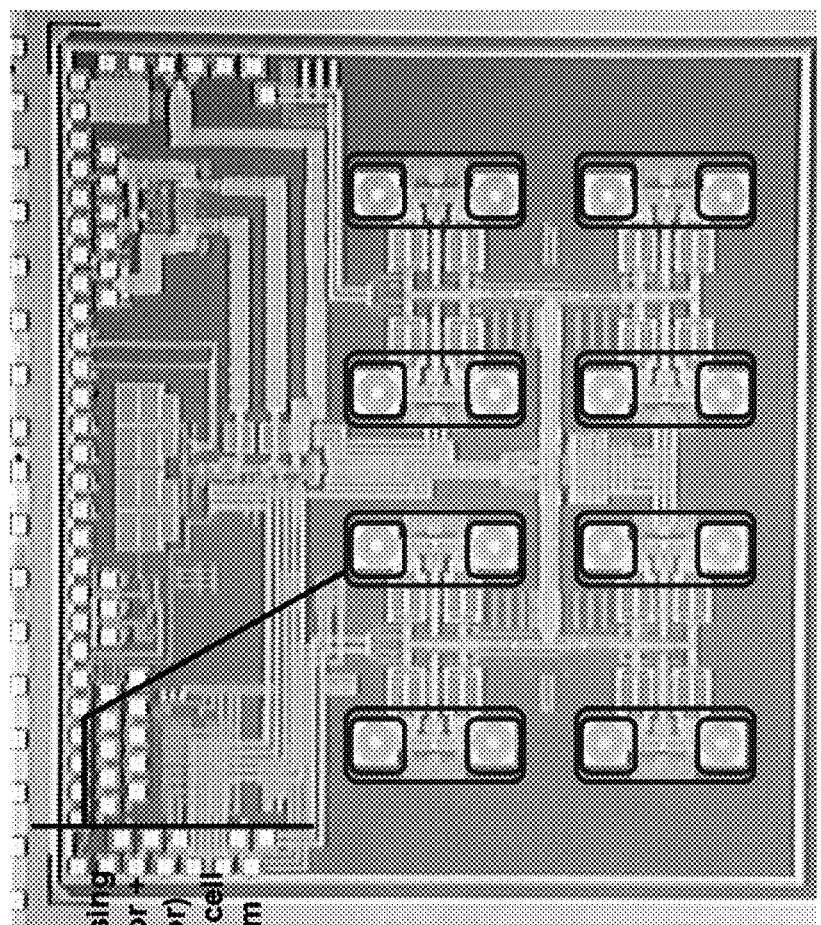
FIG. 35 shows an illustration of a magnetic particle sensor having an array of 8 cells implemented in a 130 nm standard CMOS process.

FIG. 34 shows an illustration of one cell of a magnetic particle sensor implemented in a 130 nm standard CMOS process. FIG. 35 shows an illustration of a magnetic particle sensor having an array of 8 cells implemented in a 130 nm standard CMOS process. Note that each of the eight cells includes a differential sensing pair (active sensor and reference sensor) with each sensor having dimensions of about 140 μm×140 μm.

Burst Mode Differential Frequency Counting

The long term frequency instability of the sensor and reference oscillators is believed to be mostly caused by frequency flicker (1/f) noise, largely caused by various stochastic relaxation processes, e.g., trapping/releasing of carriers by the active device's oxide-channel interface. A burst mode differential frequency counting scheme can be employed to effectively suppress this variation.

For example, in some embodiments, at one burst measurement, both sensors are measured with a smallest possible reset time or delay between measurements in an attempt to guarantee the same common-mode condition. Then the sensor can be turned off and remain in standby for a period on the order of the equivalent time constant of the specific flicker process. The next burst measurement is then performed. The two adjacent burst differential data samples are far less correlated and the averaging result effectively suppresses frequency instability due to frequency flicker noise. One can in principle repeat this measure, wait, measure process for as many cycles as one may desire.

Figure 36:
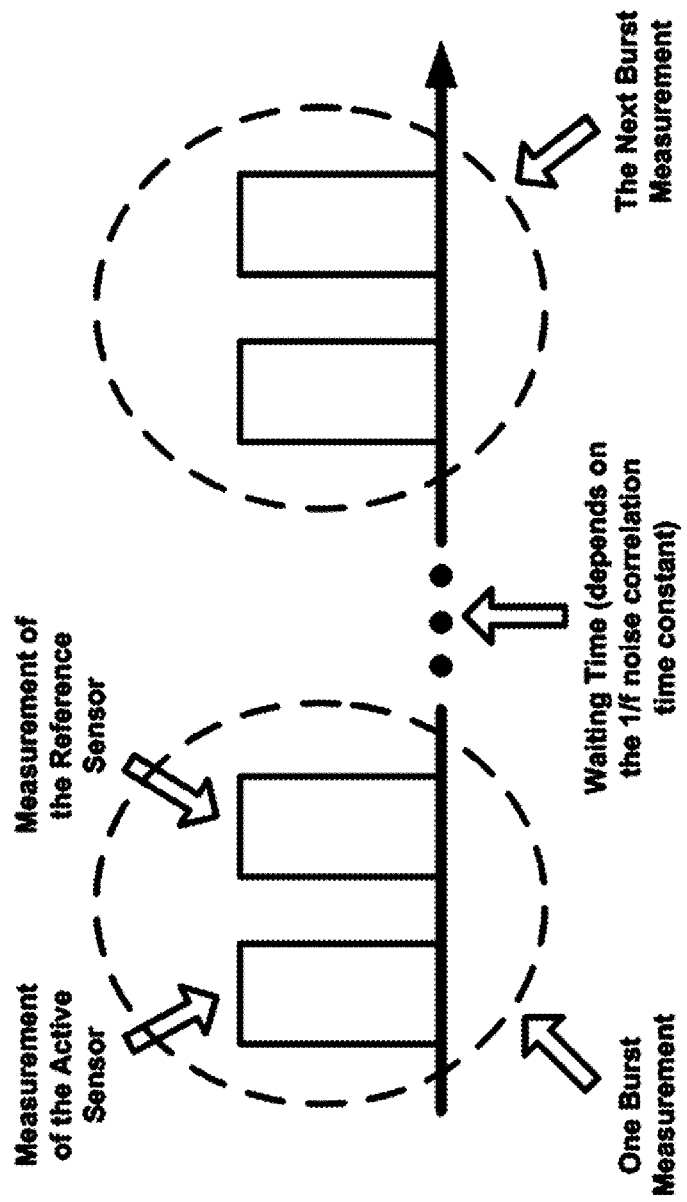
FIG. 36 shows a time line illustrating burst mode differential counting.

FIG. 36 shows a time line that illustrates burst mode differential counting as described above. Within each burst measurement, there is a measurement of both the active sensor and the reference sensor. Then, following a waiting time (which depends on the 1/f noise correlation time constant), there is another one burst measurement.

Burst Mode Differential Frequency Counting for an Array

The burst mode differential frequency counting can also be employed in the sensor array, particularly when the array size N is large. This array burst mode measurement scheme can be viewed as N burst mode differential frequency counting interleaved in time. During the standby time of the previously turned-on sensors, other sensor cells can be activated and measured. Thus measurement of all of the differential cells is effectively interleaved, which also improves the total data acquisition time.

Figure 37:
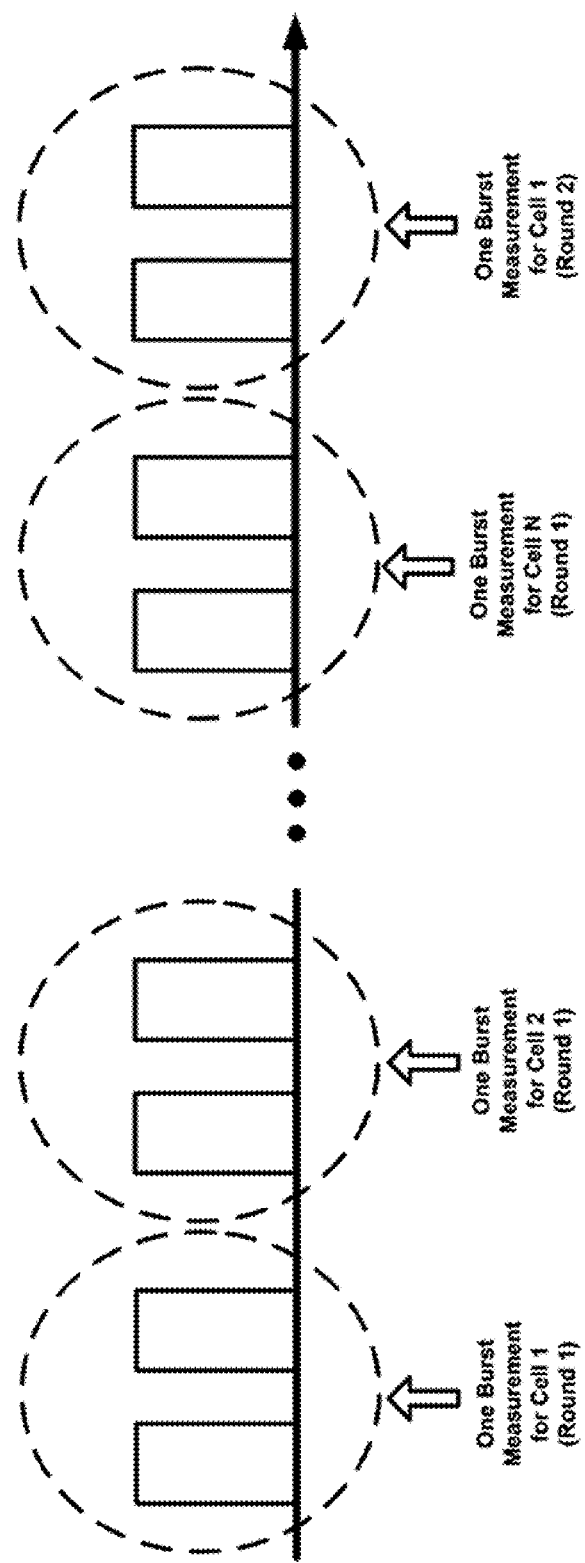
FIG. 37 shows a time line illustrating burst mode differential counting for an array.

FIG. 37 shows a time line illustrating burst mode differential counting for an array. Within a burst measurement, there are sequential measurements of both the active sensor and the reference sensor for cells 1 to N ("round 1"). Then, following a waiting time (which depends on the 1/f noise correlation time constant and the total number of cells that will be measured), there is another burst measurement of both the active sensor and the reference sensor for cells 1 to N ("round 2"). This process can be repeated for as many rounds as one may desire. The order in which the N cells are measured can also be determined in any convenient way, such as using the values 1 to N as ordinals, or by selecting cells for measurement in a pattern that picks different values in the range 1 to N, where N is an integer greater than 2, according to any pattern, or according to a random selection, so long as all of the N cells are measured once during each round.

Portable Instrument

An integrated measurement system array as described hereinabove can be used as the basis for a molecular-level diagnosis system. Such a system, such as can be used for Point-of-Care (POC) molecular-level diagnosis, can provide advanced bio-sensing systems having high sensitivity and portability (e.g. battery operation) at low power consumption at a low cost. Such systems can be used for a variety of applications such as in-field medical diagnosis, epidemic disease control, biohazard detection, and forensic analysis.

A molecular-level diagnosis system can use at least one integrated measurement system array as described hereinabove. An electronic circuit, typically including a microcontroller or a microcomputer-based system, can calculate and record measurement results, such as the difference of the downshifted active sensor oscillator frequency and the downshifted reference sensor oscillator frequency for each sensor cell. A source of power, such as one or more batteries, or any other suitable power source and/or power supply, can be electrically coupled to the integrated measurement system array and the electronics circuit. An optional display can be configured to indicate a presence or an absence of one or more magnetic particles within a sample volume of the active sensor oscillator of each sensor cell. In other embodiments, with or without a display, a measurement can be sent via a wired or wireless connection to another computer or computer network. Such portable instruments as described hereinabove can include a microfluidic structure, such as a polydimethylsiloxane (PDMS) microfluidic structure configured to provide a sample to a sample volume.

Definitions

Recording a result or a time such as for example, recording results of a frequency difference or a start time is understood to mean and is defined herein as writing output data to a storage element, to a machine-readable storage medium, or to a storage device. Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording data for later use (e.g., writing a data to memory or to digital memory) can be performed to enable the use of the recorded information as output, as data for display to a user, or as data to be made available for later use. Such digital memory elements or chips can be standalone memory devices, or can be incorporated within a device of interest. "Writing data" or "writing output data to memory" is defined herein as including writing transformed data to registers within a microcomputer. As such, recording such as "Writing output data" or "writing data to memory" includes streaming data, such as streaming data sent from a transmission circuit.

"Microprocessor" is defined herein as synonymous with microcomputer, microcontroller, and digital signal processor ("DSP"). It is understood that memory used by the microprocessor, including for example a calculation algorithm coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microprocessor functions, either in hardware logic, software emulation of a microprocessor, or by a combination of the two. Apparatus having any of the inventive features described herein can operate entirely on one microprocessor or can include more than one microprocessor.

Modeling and Measurement of the Burst Mode Differential Frequency Counting

Figure 38:
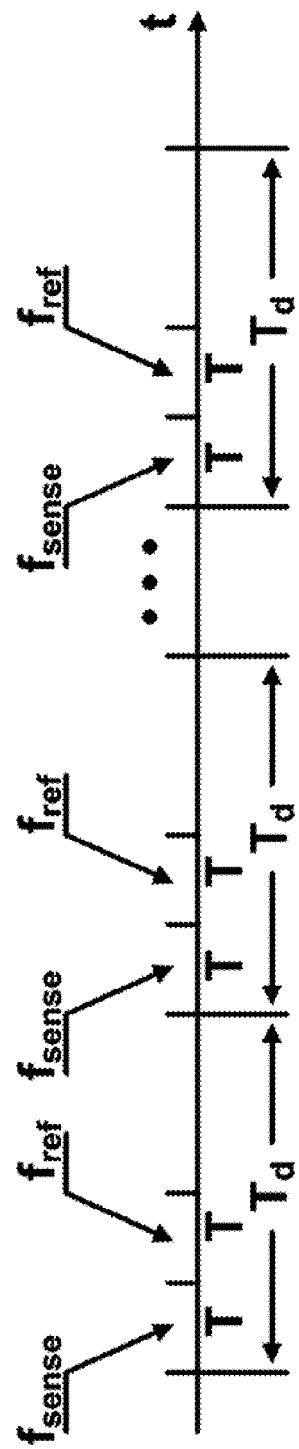
FIG. 38 shows a time line illustrating burst mode differential frequency counting.

FIG. 38 shows a time line illustrating burst mode differential frequency counting with the timing specifications denoted. Without loss of generality, for the following description, we use an exemplary burst mode differential frequency counting as shown in FIG. 38, where $f_{sense}$ and $f_{ref}$ are the frequency measurements of the sensing oscillator and the reference oscillator, respectively. T is the window time for the frequency counting and the Td is the period of one single burst mode operation.

Assuming there are N samples for the burst mode differential frequency counting, the measurement uncertainty (variance) after N sample averaging can be formulated as:

$$\frac{\sigma_{\Delta f}^2}{f_o} N = \frac{(\Delta T)^2}{T^2} = \frac{1}{T^2 \omega_0^2} E \left\{ \left[ \frac{1}{N} \sum_{i=1}^{N} [\{\phi_{sense}(t+(i-1)T_d) - \phi_{sense}(t+T+(i-1)T_d)\} - \{\phi_{ref}(t+T+(i-1)T_d) - \phi_{ref}(t+2T+(i-1)T_d)\}] \right]^2 \right\}, \quad \text{Eqn. (4)}$$

where $\phi_{sense}$ and $\phi_{ref}$ are the phase noise functions for the sensing oscillator and the reference oscillator in time domain. Assuming $\phi_{sense}$ and $\phi_{ref}$ are identical but independent noise processes, Equation 4 can be further simplified as $$\frac{\sigma_{\Delta f}^2}{f_o} N = \frac{2 \times 4}{\pi \omega_0^2 T^2 N^2} \int_0^{+\infty} s_\phi(\omega) \cdot \sin^2\left(\frac{\omega T}{2}\right) \frac{\sin^2(N\omega T_d/2)}{\sin^2(\omega T_d/2)} d\omega, \quad \text{Eqn. (5)}$$

where $S_\phi(\omega')$ is the phase noise profile of the sensing oscillator or the reference oscillator since they are both of identical noise process, and $\omega'$ denotes the offset frequency of the phase noise profile.

The ratio between this total N sample averaged measurement uncertainty (variance) and the unaveraged measurement uncertainty can be defined as the following noise power reduction factor (NRF) as:

$$NRF(N_t T_d/T) = \frac{\frac{\sigma_{\Delta f}^2}{f_0} N}{\frac{\sigma_{\Delta f}^2}{f_0}, 1} \quad \text{Eqn. (6)}$$

Figure 39:
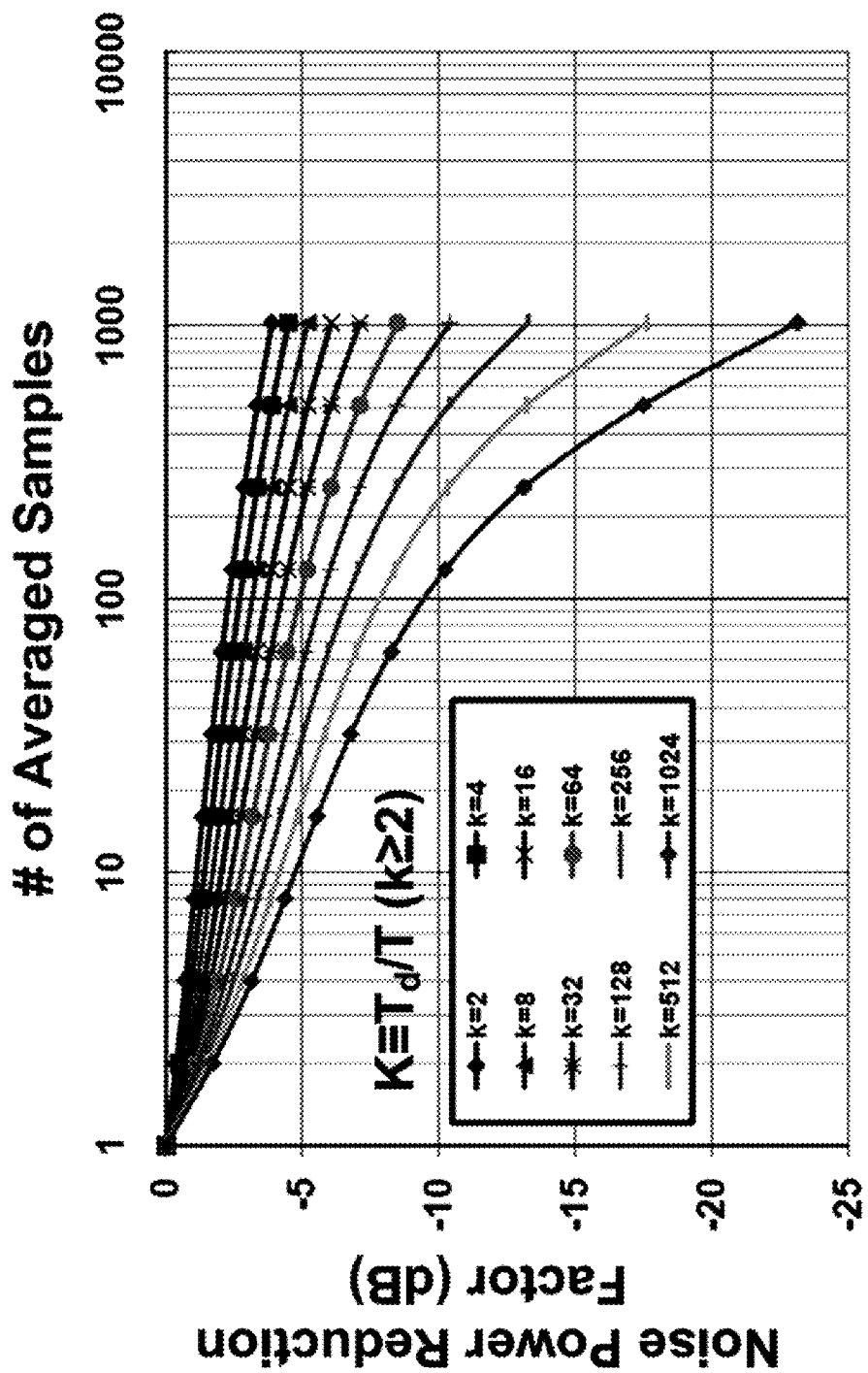
FIG. 39 shows an illustration of the noise power reduction factor for $1/f^3$ phase noise.

FIG. 39 shows an illustration of the noise power reduction factor for $1/f^3$ phase noise (flicker frequency noise). For the scenario where the phase noise is dominated by $1/f^3$ phase noise, i.e. flicker frequency noise, the NRF is calculated and plotted in the following FIG. 39. Note that this is the typical case during long time frequency counting (e.g. a typical counting time greater than 1 ms).

Figure 40:
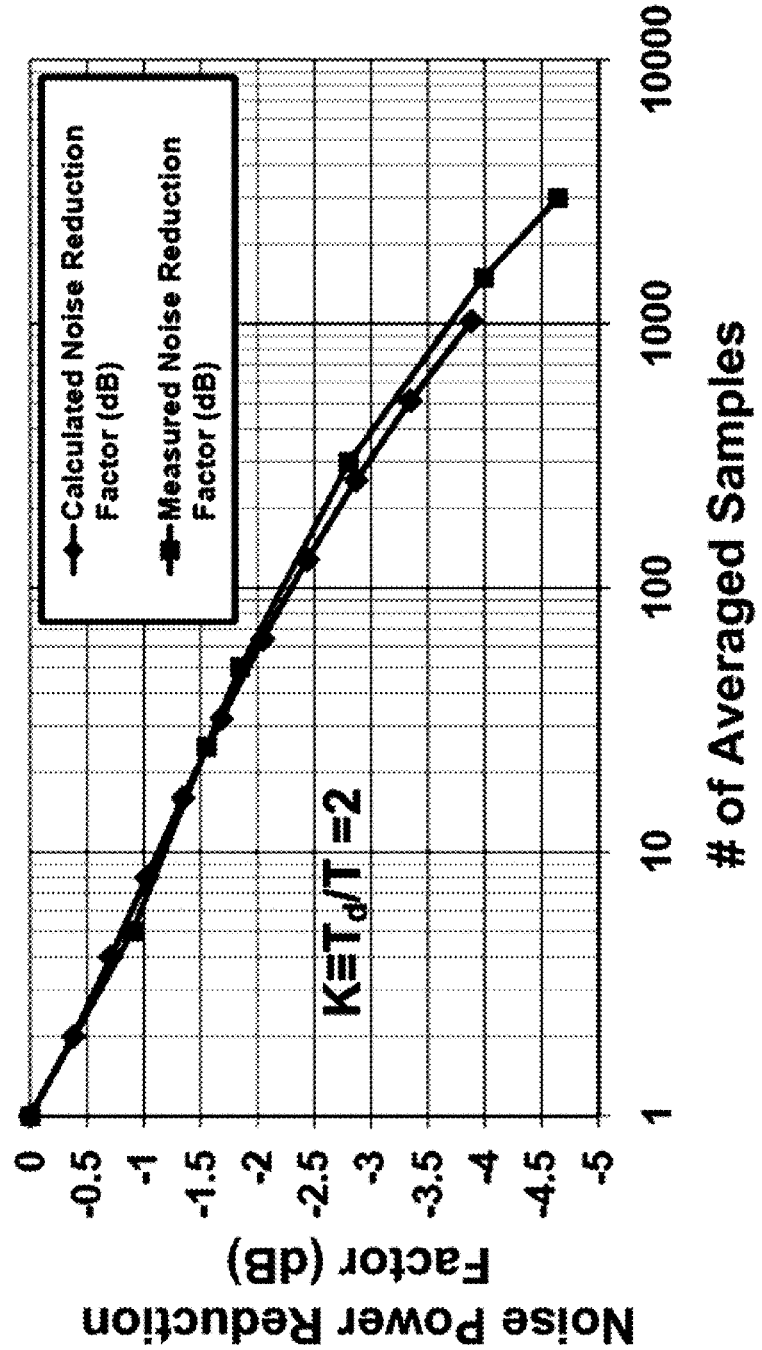
FIG. 40 shows the noise power reduction factor for $1/f^3$ phase noise at K=Td, T=2.

FIG. 40 shows the noise power reduction factor for $1/f^3$ phase noise at K=Td, T=2. In particular, for the case when there is no standby time, i.e. K=Td, T=2, the noise reduction factor NRF (N, 2) was measured and compared with the theoretically calculated one. The result is shown in FIG. 40, where close agreement was observed. This measurement was used to validate our theory and mathematical modeling.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An integrated magnetic particle measurement device for detecting a presence or absence of magnetic particles in a sample volume, comprising:
   a substrate having a surface;
   at least one sensor cell, said at least one sensor cell comprising a differential sensor pair including an active sensor oscillator configured to have an active sensor oscillator frequency, said active sensor oscillator frequency responsive to one or more magnetic particles situated within a sample volume and a reference oscillator configured to have a reference sensor oscillator frequency said at least one sensor cell configured to be operative in the absence of an externally applied magnetic field;

a selector circuit coupled to said active sensor oscillator and to said reference oscillator and configured to provide a selected one of said active sensor oscillator frequency and said reference sensor oscillator frequency at a selector circuit output terminal; and a frequency measurement circuit having a frequency measurement output terminal, said frequency measurement circuit communicatively coupled to said selector circuit output terminal said frequency measurement circuit configured to provide as a time-multiplexed output at said frequency measurement output terminal a selected one of a first count representative of said active sensor oscillator frequency and a second count representative of said reference sensor oscillator frequency, a calculated difference between said first count and said second count indicative of a presence or an absence of one or more magnetic particles within said sample volume of said active sensor oscillator of said at least one sensor cell.

2. The integrated magnetic particle measurement device of claim 1, wherein said frequency measurement circuit comprises a counter circuit.

3. The integrated magnetic particle measurement device of claim 1, wherein said frequency measurement circuit further comprises a down shift circuit electrically coupled via said selector circuit to said active sensor oscillator and said reference sensor oscillator of each sensor cell and having a down shift circuit output terminal, said down shift circuit configured to down shift in a time multiplexed manner from said at least one sensor cell said active sensor oscillator frequency to a downshifted active sensor oscillator frequency and said reference sensor oscillator frequency to a downshifted reference sensor oscillator frequency, and to provide said downshifted active sensor oscillator frequency and said downshifted reference sensor oscillator frequency at said down shift circuit output terminal.

4. The integrated magnetic particle measurement device of claim 3, wherein said down shift circuit has a two-step downconversion architecture.

5. The integrated magnetic particle measurement device of claim 4, further comprising an input terminal configured to accept an external frequency and said down shift circuit includes a first digital divider electrically coupled to an input of a first mixer, said first digital divider configured to generate a first local oscillator frequency and a second digital divider electrically coupled to an input of a second mixer, said second digital divider configured to generate a second local oscillator frequency.

6. The integrated magnetic particle measurement device of claim 1, wherein said selector circuit comprises a multiplexer.

7. The integrated magnetic particle measurement device of claim 1, comprising a number N of sensor cells configured as an integrated measurement array, where N is an integer greater than 1.

8. The integrated magnetic particle measurement system device of claim 1, wherein at least one of said active sensor oscillator and said reference sensor oscillator comprises a low noise oscillator.

9. The integrated magnetic particle measurement system device of claim 8, wherein said low noise oscillator comprises a complementary cross-coupled pair.

10. The integrated magnetic particle measurement system device of claim 9, wherein said complementary crosscoupled pair comprises at least a selected one of an NMOS pair and a PMOS pair disposed on said substrate in a symmetrical layout and configured to suppress flicker noise.

11. The integrated magnetic particle measurement system device of claim 1, wherein said active sensor oscillator and said reference sensor oscillator are configured to operate at two different non-harmonically related frequencies.

12. The integrated magnetic particle measurement device of claim 1, wherein a temperature of said active sensor oscillator and a temperature of said reference sensor oscillator are substantially controlled by a common temperature controller.

13. The integrated magnetic particle measurement device of claim 12, wherein said common temperature controller comprises a proportional to absolute temperature circuit configured to sense a temperature of at least one of said sensor cells.

14. The integrated magnetic particle measurement device of claim 1, wherein said integrated measurement system further comprises at least one digital input configured to control said multiplexer.

15. The integrated magnetic particle measurement device of claim 1, wherein said integrated measurement system is implemented in CMOS.

16. The integrated magnetic particle measurement device of claim 1, wherein at least of one of said active sensor oscillator and said reference sensor oscillator comprises an LC resonator.

17. A molecular-level diagnosis system comprising:
at least one integrated magnetic particle measurement device according to claim 1;
an electronic circuit configured to calculate and record for each sensor cell said difference of said active sensor oscillator frequency and said reference sensor oscillator frequency; and
a power supply electrically coupled to said integrated measurement device and said electronic circuit.

18. The molecular-level diagnosis system of claim 17, further comprising a display configured to indicate a presence or an absence of one or more magnetic particles within a sample volume of said active sensor oscillator of each sensor cell, said display electrically powered by said power supply.

19. The molecular-level diagnosis system of claim 17, wherein said molecular-level diagnosis system is configured as a portable system.

20. The molecular-level diagnosis system of claim 17, wherein said power supply comprises at least one battery.

21. The molecular-level diagnosis system of claim 17, further comprising a microfluidic structure configured to provide a sample to a sample volume.

22. The molecular-level diagnosis system of claim 21, wherein said microfluidic structure comprises polydimethylsiloxane.

23. The molecular-level diagnosis system of claim 17, wherein said molecular-level diagnosis system is configured as a system selected from the group of systems consisting of a Point-of-Care (POC) system, an in-field medical diagnosis system, an epidemic disease control system, a biohazard detection system, a PCR system, and a forensic analysis system.

24. The molecular-level diagnosis system of claim 17, wherein said electronic circuit comprises a microprocessor.

25. The molecular-level diagnosis system of claim 17, wherein said active sensor oscillator frequency and said reference sensor oscillator frequency are downshifted before the difference between them is calculated.

26. A method for detecting one or more magnetic particles, comprising the steps of:

(a) providing an integrated measurement system having a plurality of N sensor cells, where N is an integer greater than 1, each of said sensor cells being represented by an integer in the range of 1 to N, each of said sensor cells including an active sensor oscillator configured to have an active sensor oscillator frequency and a reference oscillator configured to have a reference sensor oscillator frequency, a difference between said active sensor oscillator frequency and said reference sensor oscillator frequency being representative of a presence or an absence of one or more magnetic particles within a sensor volume of said sensor cell;

(b) selecting an integer in the range of 1 to N;
for said selected integer,
  (b1) measuring a selected one of said active sensor oscillator frequency and said reference sensor oscillator frequency of said sensor cell;
  (b2) waiting for a first delay time; and
  (b3) measuring after said first delay time the other of said active sensor oscillator frequency and said reference sensor oscillator frequency for said sensor cell;

(c) recording a start time for said measurement according to step (b1);

(d) selecting a different integer in said range of 1 to N, and repeating steps (b1) through (b3) for said integer;

(e) repeating step (d) until all of the integers in the range 1 to N have been employed one time;

(f) determining whether a period substantially equivalent to a time constant of a flicker process has elapsed since the recording of said start time in step (c);

(g) if a period substantially equivalent to a time constant of a flicker process has elapsed since the recording of said start time in step (c), repeating steps (b) though (f) a desired number of times, and if a period substantially equivalent to a time constant of a flicker process has not elapsed since the recording of said start time in step (c), performing step (h);

(h) waiting until a period substantially equivalent to a time constant of a flicker process has elapsed since the recording of said start time in step (c), and then repeating steps (b) though (f) a desired number of times;

(i) upon completing said steps (b) through (h) said desired number of times, computing for each sensor cell a presence or absence of one or more magnetic particles; and (j) recording a result for each sensor cell indicative of said presence or absence of one or more magnetic particles.

27. An integrated magnetic particle measurement system array for detecting a presence or absence of magnetic particles in a sample volume, comprising:

a substrate having a surface;

two or more sensor cells, each of said sensor cells comprising a differential sensor pair including an active sensor oscillator configured to have an active sensor oscillator frequency, said active sensor oscillator frequency responsive to one or more magnetic particles situated within a sample volume and a reference oscillator configured to have a reference sensor oscillator frequency, said two or more sensor cells configured to be operative in the absence of an externally applied magnetic field;

a down shift circuit electrically coupled via a multiplexer to said active sensor oscillator and said reference sensor oscillator of each sensor cell and having a down shift circuit output, said down shift circuit configured to down shift in a time multiplexed manner from each of said sensor cells said active sensor oscillator frequency to a downshifted active sensor oscillator frequency and said reference sensor oscillator frequency to a downshifted reference sensor oscillator frequency; and a counter communicatively coupled to said down shift circuit output and configured to output at a count output terminal from each of said sensor cells in said time multiplexed manner, a first count representative of said active sensor oscillator frequency and a second count representative of said reference sensor oscillator frequency, and wherein a calculated difference between said first count and said second count indicates a presence or an absence of one or more magnetic particles within said sample volume of said active sensor oscillator of each sensor cell.

\* \* \* \* \*